(12) United States Patent
Nakanishi et al.

(10) Patent No.: US 8,253,320 B2
(45) Date of Patent: Aug. 28, 2012

(54) METHOD OF MANUFACTURING AN ELECTRIC OPTICAL DEVICE IN WHICH EXTERNAL CONNECTION TERMINALS ARE FORMED

(75) Inventors: Hayato Nakanishi, Toyama (JP);
Masahiro Furusawa, Chino (JP);
Mitsuru Kuribayashi, Chino (JP);
Toshimitsu Hirai, Chino (JP)

(73) Assignee: Seiko Epson Corporation, Tokyo (JP)

( * ) Notice: Subject to any disclaimer, the term of this patent is extended or adjusted under 35 U.S.C. 154(b) by 229 days.

(21) Appl. No.: 12/272,336

(22) Filed: Nov. 17, 2008

(65) Prior Publication Data
US 2009/0102369 A1    Apr. 23, 2009

Related U.S. Application Data

(62) Division of application No. 10/414,207, filed on Apr. 16, 2003, now abandoned.

(30) Foreign Application Priority Data

Apr. 18, 2002  (JP) ................................. 2002-116695
Apr. 15, 2003  (JP) ................................. 2003-110696

(51) Int. Cl.
*H01J 1/62*      (2006.01)
*H01J 63/04*     (2006.01)
(52) U.S. Cl. ........ 313/500; 313/483; 313/498; 313/504; 313/505; 313/506
(58) Field of Classification Search .................. None
See application file for complete search history.

(56) References Cited

U.S. PATENT DOCUMENTS

| 5,737,272 | A   |   | 4/1998  | Uchiyama et al. |
|-----------|-----|---|---------|-----------------|
| 5,978,059 | A   |   | 11/1999 | Ohta et al. |
| 6,303,963 | B1  | * | 10/2001 | Ohtani et al. ................. 257/350 |
| 6,486,412 | B2  |   | 11/2002 | Kato |
| 6,522,079 | B1  | * | 2/2003  | Yamada ..................... 315/169.3 |
| 6,531,815 | B1  | * | 3/2003  | Okuyama et al. ............ 313/506 |
| 6,587,177 | B2  |   | 7/2003  | Kato |

(Continued)

FOREIGN PATENT DOCUMENTS

JP    A 63-141293    6/1988

(Continued)

OTHER PUBLICATIONS

Oct. 4, 2011 Office Action issued in Japanese Patent Application No. 2008-277868 (with translation).

(Continued)

*Primary Examiner* — Natalie Walford
(74) *Attorney, Agent, or Firm* — Oliff & Berridge, PLC

(57) ABSTRACT

An electro-optical device includes an effective display region including a pixel, the pixel including a first electrode, a second electrode, and a light-emitting layer between the first electrode and the second electrode; and a wiring line connected to the second electrode at a position to the periphery of the effective display region, the wiring line including a first wiring layer and a second wiring layer that are electrically connected to each other and that overlap each other, the first wiring layer and the second wiring layer both extending in a direction in which an edge of the effective display region extends, the first wiring layer and the second wiring layer extending in the direction a distance that is longer than a distance in which the edge of the effective display region extends in the direction.

22 Claims, 28 Drawing Sheets

U.S. PATENT DOCUMENTS

| | | | |
|---|---|---|---|
| 6,633,270 B2 * | 10/2003 | Hashimoto | 345/76 |
| 6,646,708 B1 | 11/2003 | Muramatsu | |
| 6,690,110 B1 * | 2/2004 | Yamada et al. | 313/506 |
| 6,750,924 B2 * | 6/2004 | Murade | 349/38 |
| 6,825,820 B2 * | 11/2004 | Yamazaki et al. | 345/76 |
| 6,861,279 B2 * | 3/2005 | Nakanishi et al. | 438/69 |
| 6,888,605 B2 | 5/2005 | Yamaguchi | |
| 6,893,103 B2 | 5/2005 | Okada et al. | |
| 6,900,470 B2 * | 5/2005 | Kobayashi et al. | 257/88 |
| 6,909,240 B2 * | 6/2005 | Osame et al. | 315/169.1 |
| 6,965,363 B2 * | 11/2005 | Sato et al. | 345/82 |
| 7,019,718 B2 * | 3/2006 | Yamazaki et al. | 345/80 |
| 7,045,861 B2 * | 5/2006 | Takayama et al. | 257/347 |
| 7,053,548 B2 * | 5/2006 | Nakanishi | 313/506 |
| 7,158,103 B2 * | 1/2007 | Nakanishi | 345/76 |
| 7,164,460 B2 | 1/2007 | Hagiwara | |
| 7,230,593 B2 * | 6/2007 | Nakanishi | 345/80 |
| 7,935,967 B2 | 5/2011 | Takayama et al. | |
| 2002/0012096 A1 | 1/2002 | Uchiyama | |
| 2004/0135152 A1 | 7/2004 | Zhang et al. | |
| 2005/0012096 A1 * | 1/2005 | Yamazaki et al. | 257/57 |
| 2005/0201670 A1 | 9/2005 | Uchiyama | |
| 2011/0229675 A1 | 9/2011 | Namikawa et al. | |
| 2011/0263059 A1 | 10/2011 | Takayama et al. | |

FOREIGN PATENT DOCUMENTS

| | | |
|---|---|---|
| JP | U 63-83798 | 6/1988 |
| JP | U-63-174328 | 11/1988 |
| JP | A-2-135694 | 5/1990 |
| JP | A-2-234391 | 9/1990 |
| JP | A 5-29386 | 2/1993 |
| JP | A-9-1220262 | 5/1997 |
| JP | A 10-313159 | 11/1998 |
| JP | A-11-031698 | 2/1999 |
| JP | A 11-233912 | 8/1999 |
| JP | A-11-237642 | 8/1999 |
| JP | A 2000-058255 | 2/2000 |
| JP | A 2000-124263 | 4/2000 |
| JP | A-2001-102169 | 4/2001 |
| JP | A-2001-109395 | 4/2001 |
| JP | A-2001-109397 | 4/2001 |
| JP | A 2001-109405 | 4/2001 |
| JP | A 2001-215893 | 8/2001 |
| JP | A-2001-242486 | 9/2001 |
| JP | A-2001-313308 | 9/2001 |
| JP | A-2001-356366 | 12/2001 |
| JP | A-2002-040961 | 2/2002 |
| JP | A-2002-040962 | 2/2002 |
| JP | A-2002-110343 | 4/2002 |
| JP | A-2002-151276 | 5/2002 |
| JP | A-2002-287663 | 10/2002 |
| JP | A-2002-318556 | 10/2002 |
| JP | A-2003-066868 | 3/2003 |
| JP | A-2003-295793 | 10/2003 |
| JP | A-2004-4663 | 1/2004 |
| JP | A-2004-004663 | 1/2004 |

OTHER PUBLICATIONS

Dec. 21, 2010 Office Action issued in Japanese Patent Application No. 2010-157651 (English translation only).
Dec. 9, 2008 Office Action issued in Japanese Patent Application No. 2005-208227 (English translation only).
Dec. 21, 2010 Office Action issued in Japanese Patent Application No. 2009-016293 (English translation only).
May 31, 2011 Office Action issued in Japanese Patent Application No. 2011-031754 (English translation only).
Jul. 1, 2008 Office Action issued in Japanese Patent Application No. 2005-208226 (English translation only).
Aug. 26, 2008 Office Action issued in Japanese Patent Application No. 2005-208227 (English translation only).
May 18, 2010 Office Action issued in Japanese Patent Application No. 2009-016293 (English translation only).
May 17, 2005 Office Action issued in Japanese Patent Application No. 2003-157388 (English translation only).
Nov. 24, 2006 Office Action issued in U.S. Appl. No. 10/414,207.
Oct. 10, 2007 Office Action issued in U.S. Appl. No. 10/414,207.
Apr. 7, 2008 Office Action issued in U.S. Appl. No. 10/414,207.
Sep. 11, 2008 Office Action issued in U.S. Appl. No. 10/414,207.
Dec. 13, 2011 Office Action issued in Japanese Patent Application No. 2011-165142 (with translation).
Notification of Reasons for Refusal issued in Japanese Patent Application No. 2002-016119; mailed Nov. 22, 2005; with English-language translation.
Notification of Reasons for Refusal issued in Japanese Patent Application No. 2002-016119; mailed Jun. 27, 2006; with English-language translation.
Decision of Refusal issued in Japanese Patent Application No. 2002-016119; mailed Dec. 12, 2006; with English-language translation.
Interrogation issued in Japanese Patent Application No. 2002-016119; mailed Jan. 15, 2008; with English-language translation.
Appeal Decision issued in Japanese Patent Application No. 2002-016119; mailed Apr. 30, 2008; with English-language translation.
Notification of Reasons for Refusal issued in Japanese Patent Application No. 2006-230220; mailed Sep. 29, 2009; with English-language translation.
Notification of Reasons for Refusal issued in Japanese Patent Application No. 2006-230220; mailed Apr. 6, 2010; with English-language translation.
Notification of Reason for Refusal issued in Japanese Patent Application No. 2006-230220; mailed May 31, 2011; with English-language translation.

* cited by examiner

[Fig. 11]
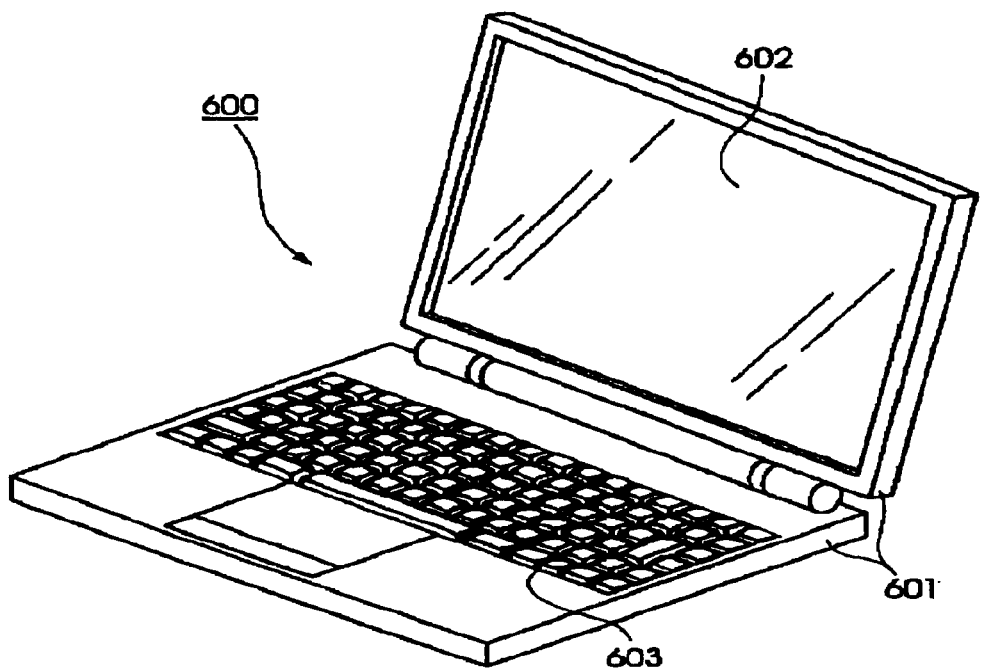
[Fig. 12]
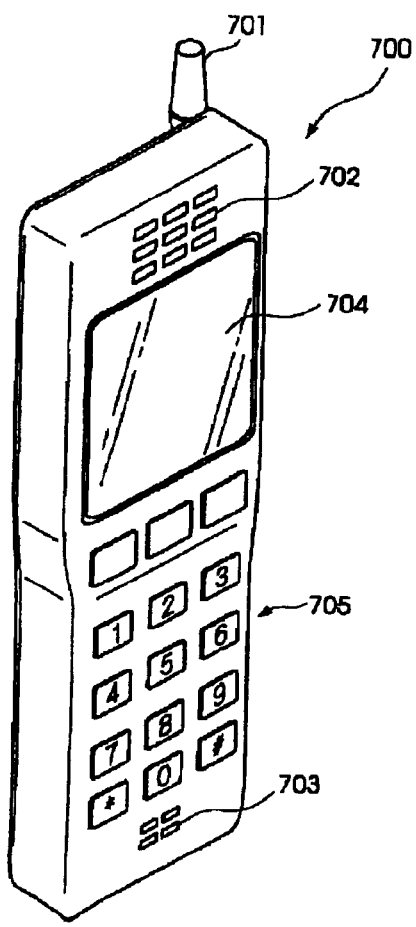

[Fig. 14]

100: WIRING LINE FORMATION APPARATUS

[Fig. 16]

[Fig. 18]
(a)
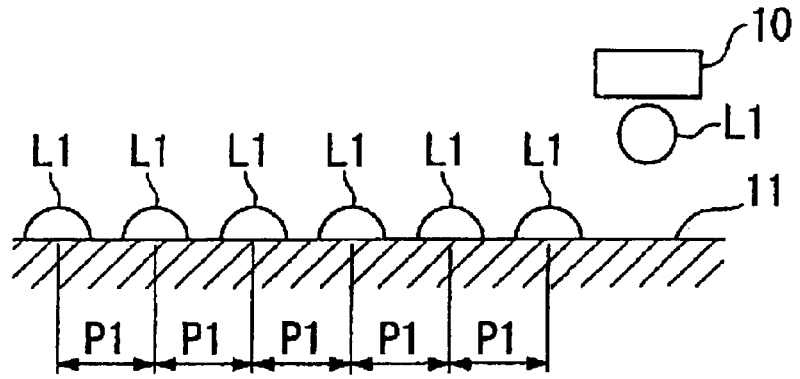
(b)
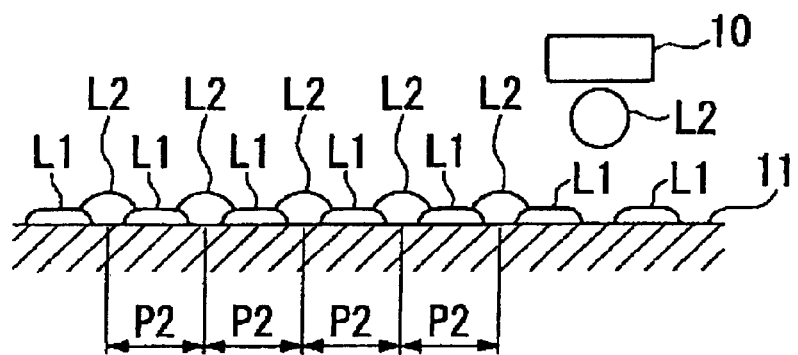
(c)
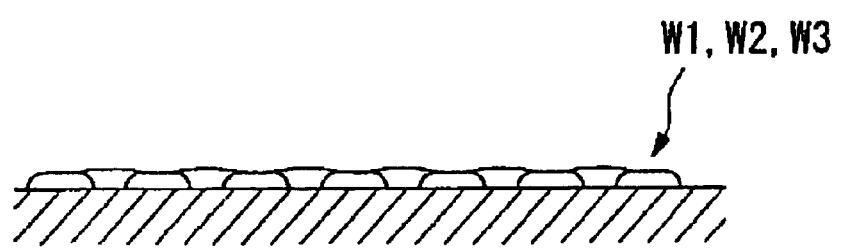

[Fig. 19]
(a)
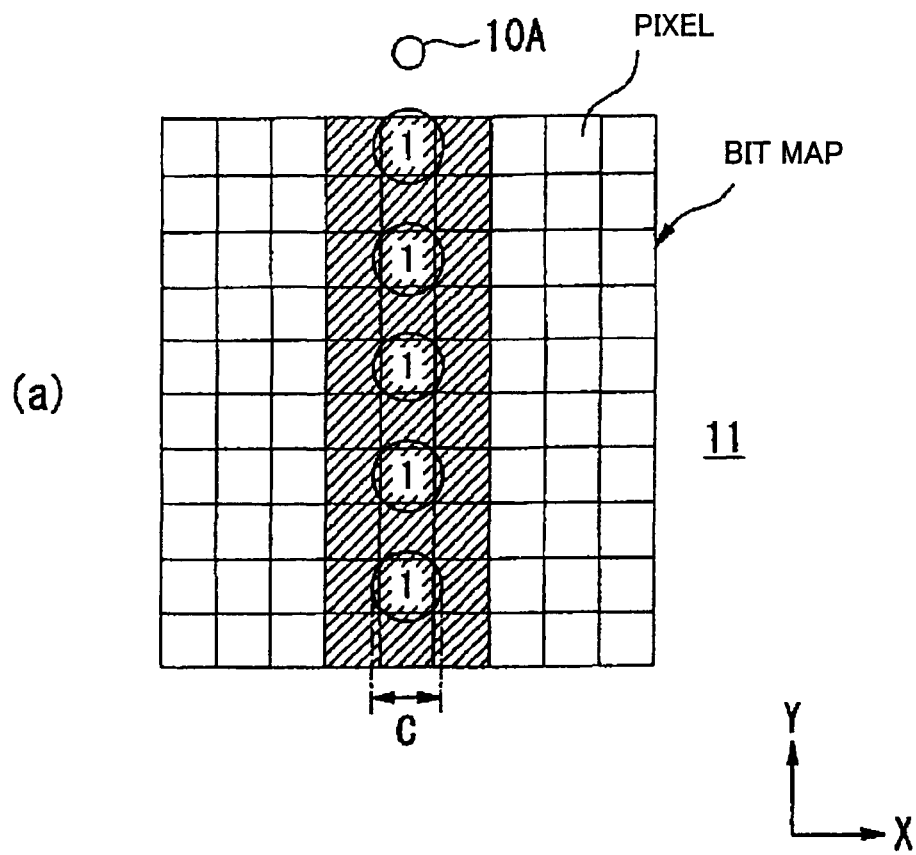
(b)
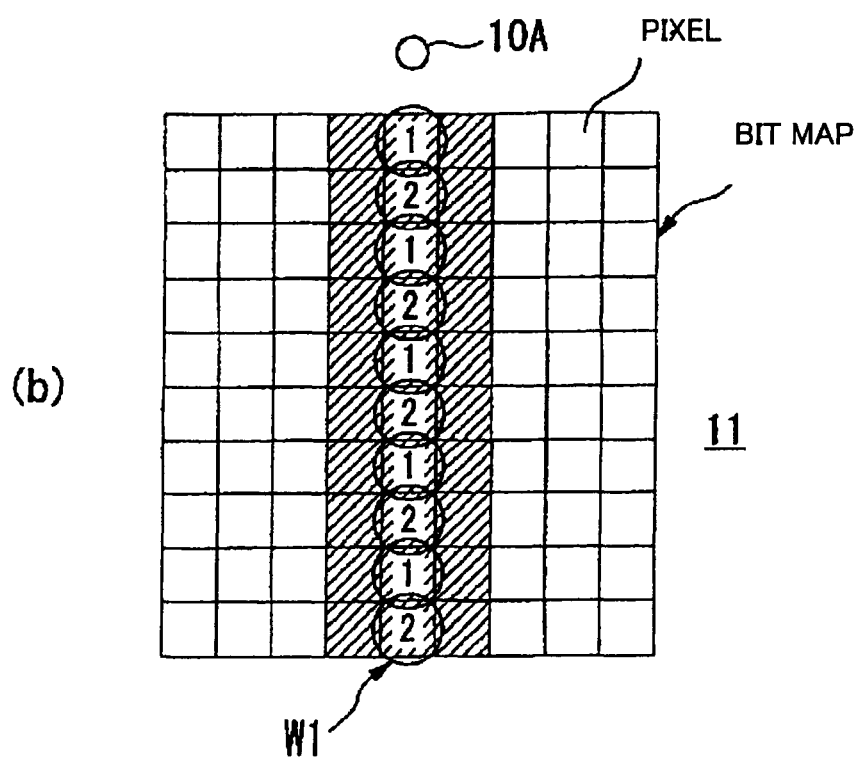

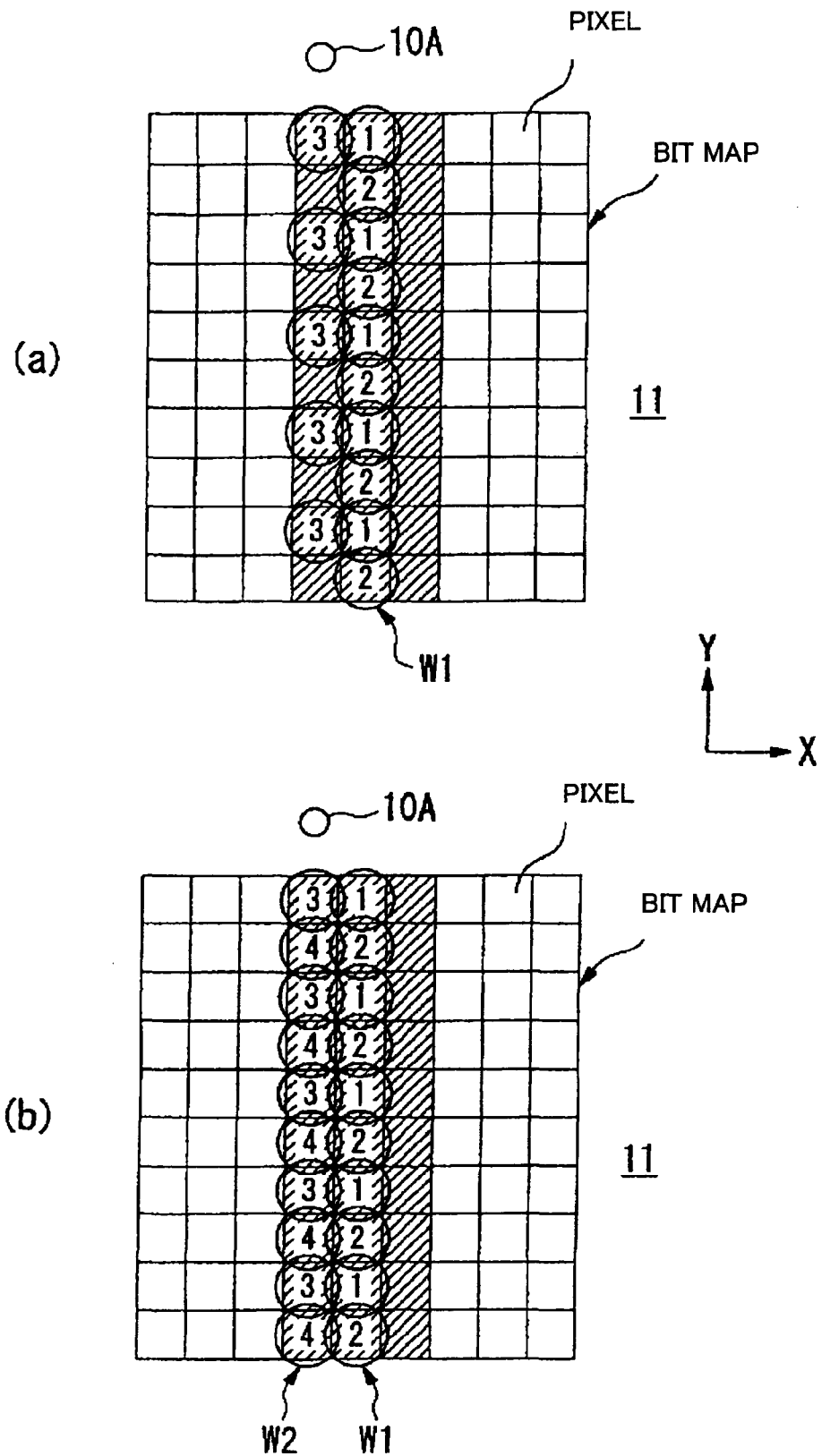
[Fig. 20]

[Fig. 21]
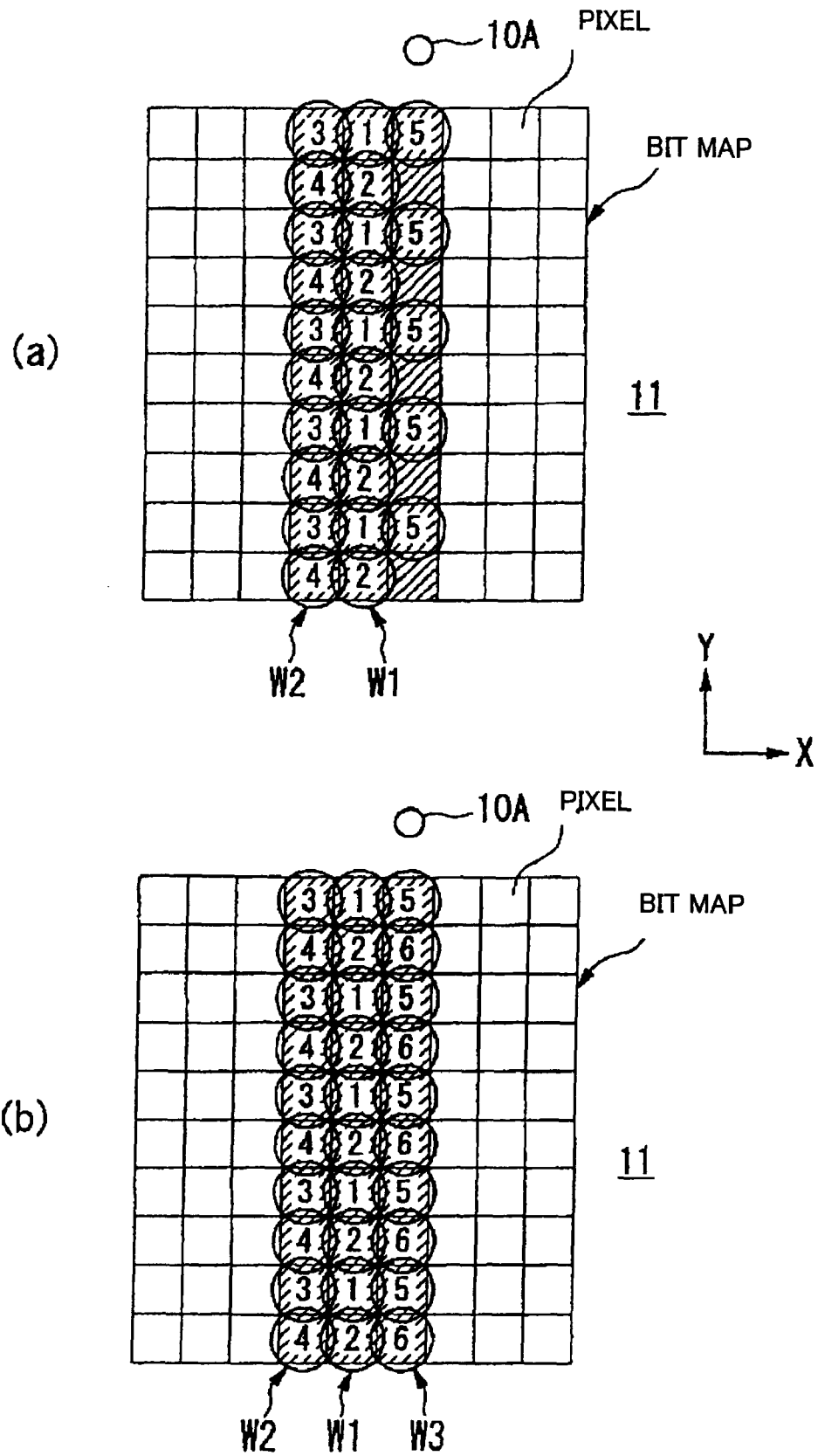

[Fig. 22]
(a)
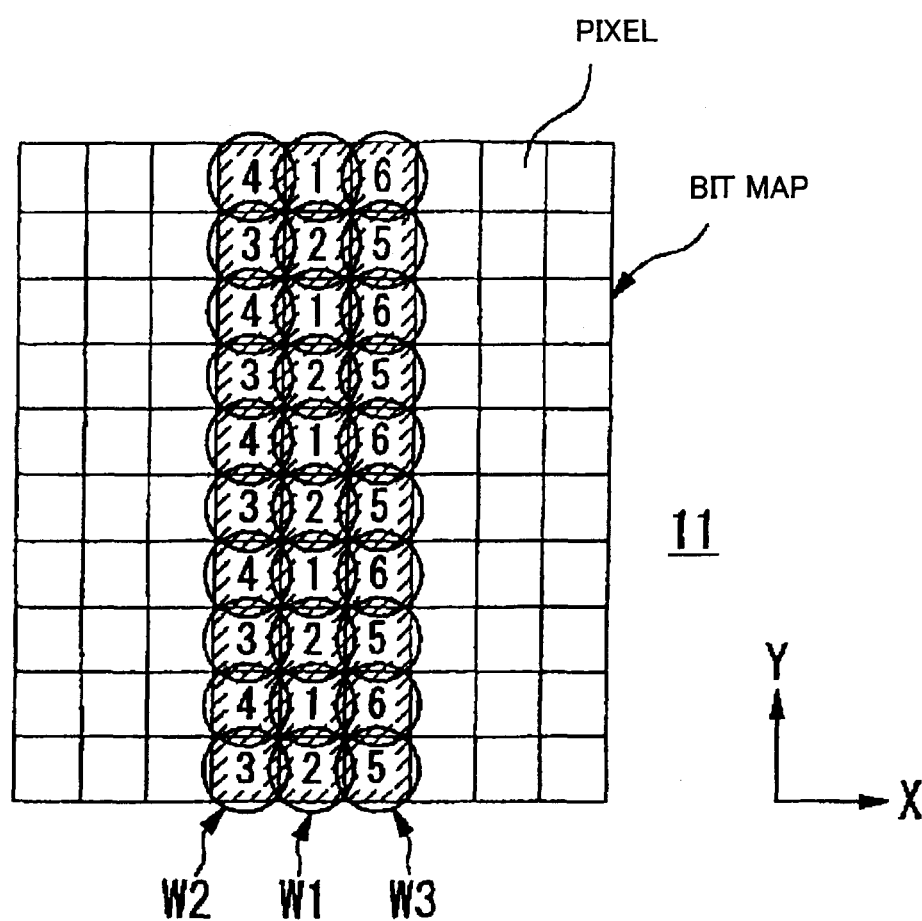

[Fig. 23]
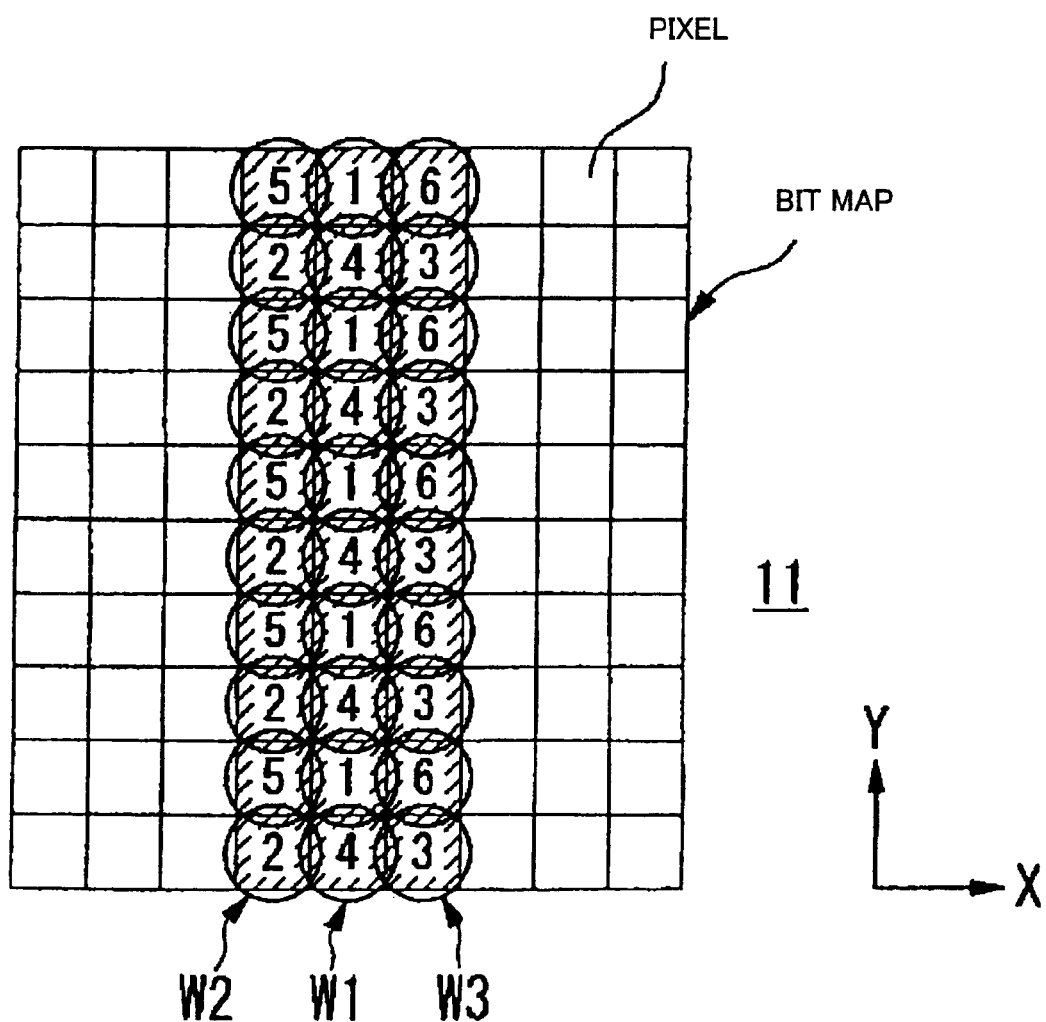

[Fig. 24]
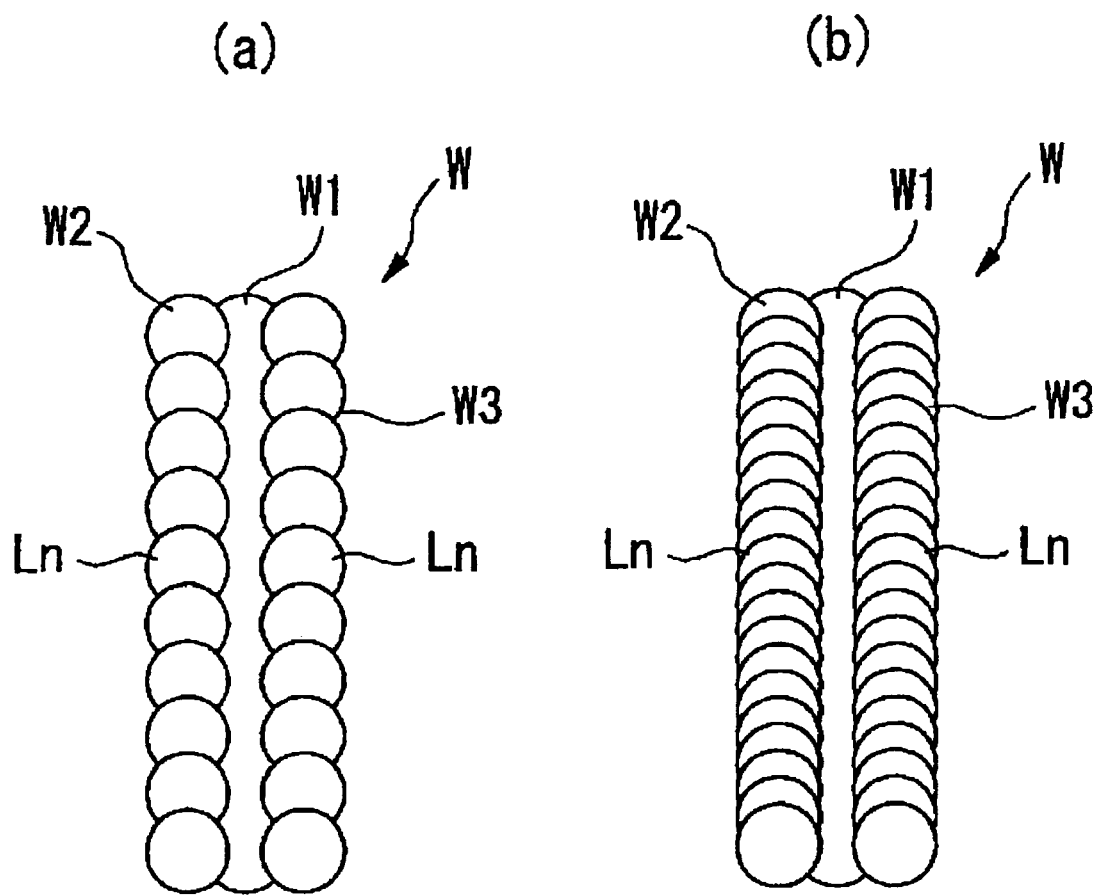

METHOD OF MANUFACTURING AN ELECTRIC OPTICAL DEVICE IN WHICH EXTERNAL CONNECTION TERMINALS ARE FORMED

BACKGROUND OF THE INVENTION

1. Field of Invention

The present invention relates to electro-optical devices and electronic apparatuses. More specifically, the invention relates to an electro-optical device including an organic electroluminescent material and to an electronic apparatus including the electro-optical device.

2. Description of Related Art

The related art includes color electro-optical devices in which light-emitting elements made of light emitting material, such as organic fluorescent material, are sandwiched between pixel electrodes (anodes) and cathodes, in particular an organic electroluminescence (organic EL) display device employing organic EL material as the light emitting material. A related art electro-optical device (the organic EL display element) is summarized below.

FIG. 13 is a schematic illustrating the wiring structure of the related art electro-optical device. As shown in FIG. 13, a plurality of scanning lines 901, a plurality of signal lines 902 extending in the direction of intersecting the scanning lines 901 and a plurality of light-emitting power source wiring lines 903 extending in parallel to the signal lines 902 are arranged in the related art electro-optical device, and a pixel region A is provided at each intersection of the scanning lines 901 and the signal lines 902. Each of the signal lines 902 is connected to a data line driving circuit 904 comprising shift registers, level shifters, video lines and analog switches. Each of the scanning lines 901 is connected to a scanning line driving circuit 905 comprising shift registers and level shifters.

Further, each of the pixel regions A is provided with a switching thin film transistor 913 a gate electrode of which is supplied through the scanning line 901 with scanning signals, a holding capacitor Cap to hold image signals supplied through the switching thin film transistor 913 from the signal line 902, a current thin film transistor 914 a gate electrode of which is supplied with image signal held by the holding capacitor Cap, a pixel electrode 911 into which driving current flow from light-emitting power source wiring lines 903 when being electrically connected to the light-emitting power source wiring lines 903 through the current thin film transistor 914, and a light-emitting layer 910 sandwiched between the pixel electrode 911 and a cathode 912. The cathode 912 is connected to a power source circuit 931 for cathode.

The aforementioned light-emitting layer 910 includes three types of light-emitting elements; a light-emitting layer 910R emitting a red light, a light-emitting layer 910G emitting a green light and a light-emitting layer 910B emitting a blue light. The respective light-emitting layers 910R, 910G, 910B are arranged in striped shapes. Further, each of the light-emitting power source wiring lines 903R, 903G, 903B connected respectively to the light-emitting layers 910R, 910G, 910B through the current thin film transistors 914 is connected to a light-emitting power source circuit 932. The light-emitting power source wiring lines are arranged for every color, because the driving potentials of the light-emitting layers 910 are different for every color.

In the above constitution, when scanning signals are supplied to the scanning lines 901 to turn on the switching thin film transistors 913, the electric charge corresponding to image signals supplied to the signal lines 902 at that time is held in the holding capacitors Cap. The ON/OFF state of the current thin film transistors 914 is determined in accordance with the quantity of electric charge held in the holding capacitors Cap. In addition, current flow through the current thin film transistors 914 from the light-emitting power source wiring lines 903R, 903G, 903B to the pixel electrodes 911, and driving current flow through the light-emitting layer 910 to the cathode 912. At that time, the quantity of emitted light corresponding to that of current flowing through the light-emitting layer 910 is obtained.

SUMMARY OF THE INVENTION

The electro-optical device shown in FIG. 13 may include the scanning lines 901, the signal lines 902, the cathode 912, the light-emitting power source wiring lines 903 (903R, 903G, 903B), the scanning line driving circuit 905 and the pixel regions A which are formed on a transparent substrate (a display substrate) such as a glass substrate, and the power source circuit 931 for cathode, the light-emitting power source circuit 932, the data line driving circuit 904 and the like are arranged on a flexible substrate (a relay substrate) having flexibility.

In case of such constitution, it is required that the flexible substrate is fixed to the transparent substrate, and then the electrical communication of the scanning lines 901, the signal lines 902, the cathode 912 and the light-emitting power source wiring lines 903 is executed with the circuits formed on the flexible substrate. The fixation and the electrical connection of the transparent substrate and the flexible substrate are accomplished by arranging an anisotropic conductive film containing conductive particles between the transparent substrate and the flexible substrate and then pressing the flexible substrate onto the transparent substrate.

In order to make the light-emitting layer 910 provided in the aforementioned electro-optical device stably emit a light, it is required to make variation in potential of the driving current applied to the pixel electrodes 911 from the light-emitting power source wiring lines 903 as small as possible. Specifically, the electro-optical device shown in FIG. 13 is a current driven electro-optical device, and in order to reduce or prevent defects in display such as non-uniformity of display, deterioration of contrast and the like, it is necessary to greatly suppress a voltage drop due to a wiring resistance of the cathode 912 and the light-emitting power source wiring lines 903 and the like. In this regard, the cathode 912 and the light-emitting power source wiring lines 903 are formed to have wider widths than those of the scanning lines 901 and the signal lines 902.

When the transparent substrate and the flexible substrate are fixed to each other, in order to obtain the uniformity in electrical resistance mainly generated in the pressing portions, it is required to make the pressing conditions equal all over the fixing portions. In order to satisfy this requirement, it is necessary to make the shape of terminals provided in the fixing portions and connected to various types of wiring lines described above equal.

However, as described above, since the electro-optical device shown in FIG. 13 is a current driven electro-optical device, it is difficult to narrow the line widths of the cathode 912 and the light-emitting power source wiring lines 903 in consideration of the voltage drop rendered due to the wiring resistance and the like. Further, since the numbers of the scanning lines 901 and the signal lines 902 are large and it is necessary to obtain the thinness of line and the narrowness of pitch in order to arrange all of the lines, it is also difficult to make the line width of the scanning lines 901 and the signal lines 902 as wide as the line widths of the cathode 912 and the light-emitting power source wiring lines 903.

The present invention addresses the above and/or other problems, and provides an electro-optical device capable of addressing or solving non-uniformity in electrical resistance of the fixing portions and causing no display problem, such as deterioration of contrast, etc., by making the pressing conditions of the display substrate and the relay substrate equal all over the fixing portions, and an electronic apparatus including an electro-optical device.

In order to address or solve the above, a method of manufacturing an electro-optical device according to the present invention is provided in which external connection terminals are formed. The method includes forming the external connection terminals by applying liquid material containing conductive material.

Further, an insulating film having convex portions is formed on the external connection terminals, and the liquid material is applied to regions defined by the convex portions.

Furthermore, the liquid material is applied using an inkjet method.

Furthermore, the present invention provides an electro-optical device manufactured using the aforementioned manufacturing method.

Furthermore, the present invention provides an electronic apparatus including the electro-optical device described above.

BRIEF DESCRIPTION OF THE DRAWINGS

FIG. 11 is a schematic illustrating an example of an electronic apparatus including the electro-optical device according to an exemplary embodiment of the present invention;

FIG. 12 is a perspective view illustrating a mobile phone as another electronic apparatus;

FIGS. 18(a)-18(c) are schematics illustrating an exemplary embodiment of a pattern formation method according to the present invention;

FIGS. 19(a) and 19(b) are schematics illustrating a state where liquid droplets are arranged based on bit map data set up on a substrate;

FIGS. 20(a) and 20(b) are schematics illustrating a state where liquid droplets are arranged based on bit map data set up on a substrate;

FIGS. 21(a) and 21(b) are schematics illustrating a state where liquid droplets are arranged based on bit map data set up on a substrate;

FIG. 22(a) is a schematic illustrating another exemplary embodiment of a state where liquid droplets are arranged based on bit map data set up on a substrate;

FIG. 23 is a schematic illustrating another exemplary embodiment of a state where liquid droplets are arranged based on bit map data set up on a substrate;

FIGS. 24(a) and 24(b) are schematics illustrating another exemplary embodiment of the pattern formation method according to the present invention;

DETAILED DESCRIPTION OF PREFERRED EMBODIMENTS

An electro-optical device and an electronic apparatus according to an exemplary embodiment of the present invention is described in detail with reference to the drawings. Further, in order to make respective layers or members recognizable in the respective drawings which are referred to in the following description, the respective layers or the respective members are represented in different scales.

Figure 1:
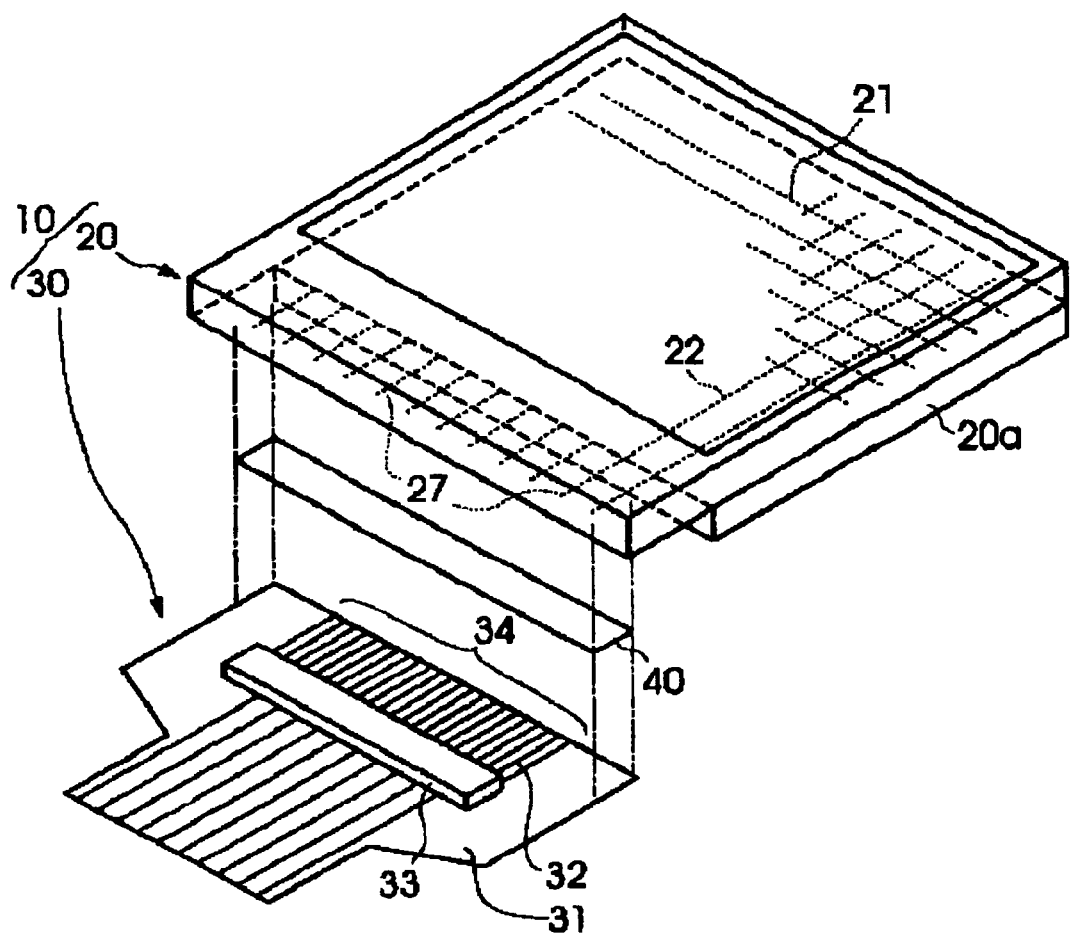
FIG. 1 is an exploded perspective view schematically illustrating an electro-optical device according to an exemplary embodiment of the present invention.

FIG. 1 is an exploded perspective view schematically illustrating an electro-optical device according to an exemplary embodiment of the present invention. As shown in FIG. 1, the electro-optical device 10 of the present exemplary embodiment largely comprises a display substrate 20 and a relay substrate 30 connected to the display substrate 20. The display substrate 20 is an active matrix type organic EL device employing thin film transistors as switching elements.

This display substrate 20 includes a plurality of scanning lines 21, and a plurality of signal lines 22 extending in a direction in which the scanning lines 21 are intersected. In addition, the display substrate 20 is provided with a display element 20a in which a plurality of light-emitting elements are formed. Further, although not shown in FIG. 1, power source lines and a cathode are formed on the display substrate 20. Furthermore, external connection terminals 27 for the scanning lines 21, the signal lines 22 and the power source lines and cathode not shown are formed at an end of the display substrate 20, respectively.

Further, the electro-optical device 10 shown in FIG. 1 schematically illustrates only significant components, and thus it should be noted that the real scanning lines 21, the real signal lines 22 and the real external connection terminals 27 are formed at a very small pitch on the display substrate 20. Furthermore, the connecting state of the external connection terminals 27 and the scanning lines 21 is omitted in FIG. 1.

The relay substrate 30 has a plurality of wiring lines 32 formed on a base substrate 31 having flexibility, and a semiconductor chip 33 is mounted at a predetermined position on the relay substrate 30. At ends of wiring line 32, external connection terminals 34 to electrically connect to wiring lines such as the scanning lines 21 and the signal lines 22 formed on the display substrate 20 are formed. Further, although only the semiconductor chip 33 is mounted on the relay substrate 30 in FIG. 1, resistors, condensers or other chip components may be mounted at predetermined positions other than the positions where the semiconductor chip 33 is mounted. Furthermore, the wiring lines 32 and the external connection terminals 34 formed on the relay substrate 30 are also schematically illustrated with enlarged pitches and with simplified structures, in order to facilitate understanding of the structures.

As shown in FIG. 1, the relay substrate 30 is fixed to the display substrate 20 through an anisotropic conductive film 40. At that time, the external connection terminals 34 of the relay substrate 30 are electrically connected to the external connection terminals 27 of the display substrate 20 through the anisotropic conductive film 40. The anisotropic conductive film 40 is a high polymer conductive film used for providing anisotropy between a pair of terminals to electrically connect them in a bundle. The anisotropic conductive film 40 is formed by dispersing a plurality of conductive particles 41b in a thermoplastic or thermosetting adhesive resin 41a, for example, as shown in FIG. 2.

Figure 2:
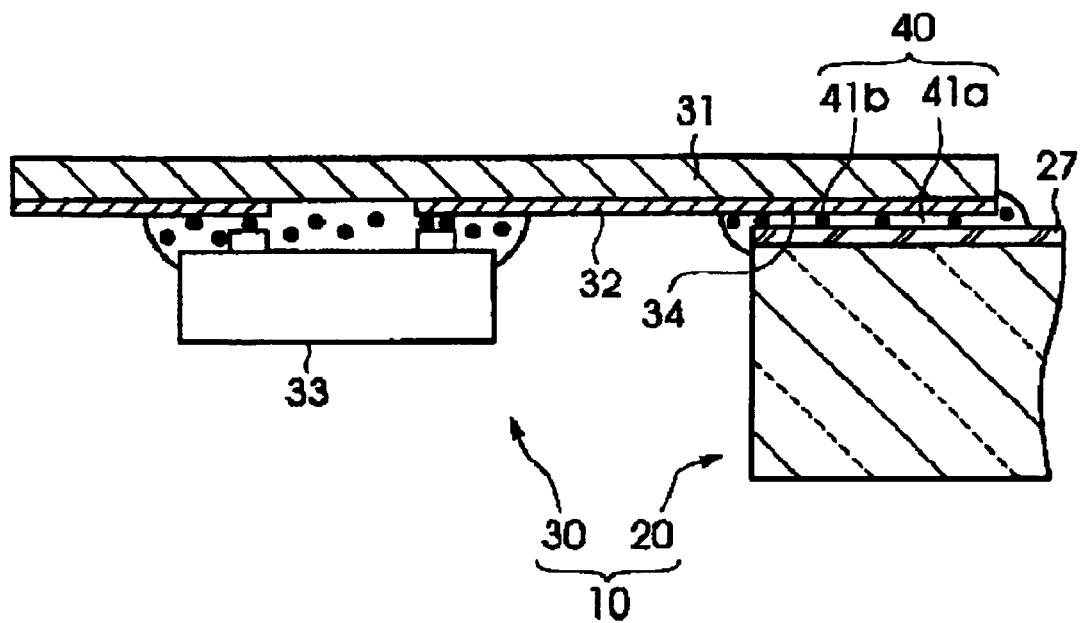
FIG. 2 is a cross-sectional view illustrating a state where a relay substrate 30 and a display substrate 20 are fixed to each other through an anisotropic conductive film 40.

FIG. 2 is a cross-sectional view illustrating a state where the relay substrate 30 and the display substrate 20 are fixed to each other through the anisotropic conductive film 40. As shown in FIG. 2, since the conductive particles 41b are sandwiched between the external connection terminals 27 formed on the display substrate 20 and the external connection terminals 34 formed on the relay substrate 30, the external connection terminals 27 and the external connection terminals 34 that are relay wiring lines are electrically connected to each other. On the other hand, the electric communication cannot be accomplished in parts other than the parts in which the external connection terminals 27 and the external connection terminals 34 are formed, because any connection terminal does not exist even when the conductive particles 41b are sandwiched. In this regard, the electrical communication can be accomplished only between the external connection terminals 27 and the external connection terminals 34.

In order to fix the display substrate 20 and the relay substrate 30 using the anisotropic conductive film 40, the display substrate 20 is mounted on a mounting support having a guide plate with a rough surface (all not shown), and then the display substrate 20 is vacuum-adsorbed. At that time, the display substrate 20 is mounted on the mounting support such that at least the part of the relay substrate 30 to be fixed to the display substrate 20 is positioned above the guide plate. The guide plate with a rough surface is used in order to reduce the temperature given to the display substrate 20 by reducing the contact area of the guide plate and the display substrate 20 to suppress the heat dissipation from the guide plate.

When the display substrate 20 is completely mounted on the mounting support, the anisotropic conductive film 40 is adhered to the parts of the display substrate 20 to which the relay substrate 30 is fixed, and then the relay substrate 30 is positioned such that the surface on which the semiconductor chip 33 is mounted faces downward and the external connection terminals 34 are positioned above the anisotropic conductive film 40. When the above processes are completed, by heating and pressing the back surface of the surface on which the external connection terminals 34 are formed using a heating/pressing head not shown, the electric communication between the external connection terminals 34 and the external connection terminals 27 formed on the display substrate 20 is established and the relay substrate 30 is fixed to the display substrate 20. At that time, the temperature given to the relay substrate 30 and the display substrate 20 from the heating/pressing head is about a hundred and several tens to several hundred ° C. and the given pressure is about several MPa. According to the above processes, the relay substrate 30 can be fixed to the display substrate 20.

Figure 3:
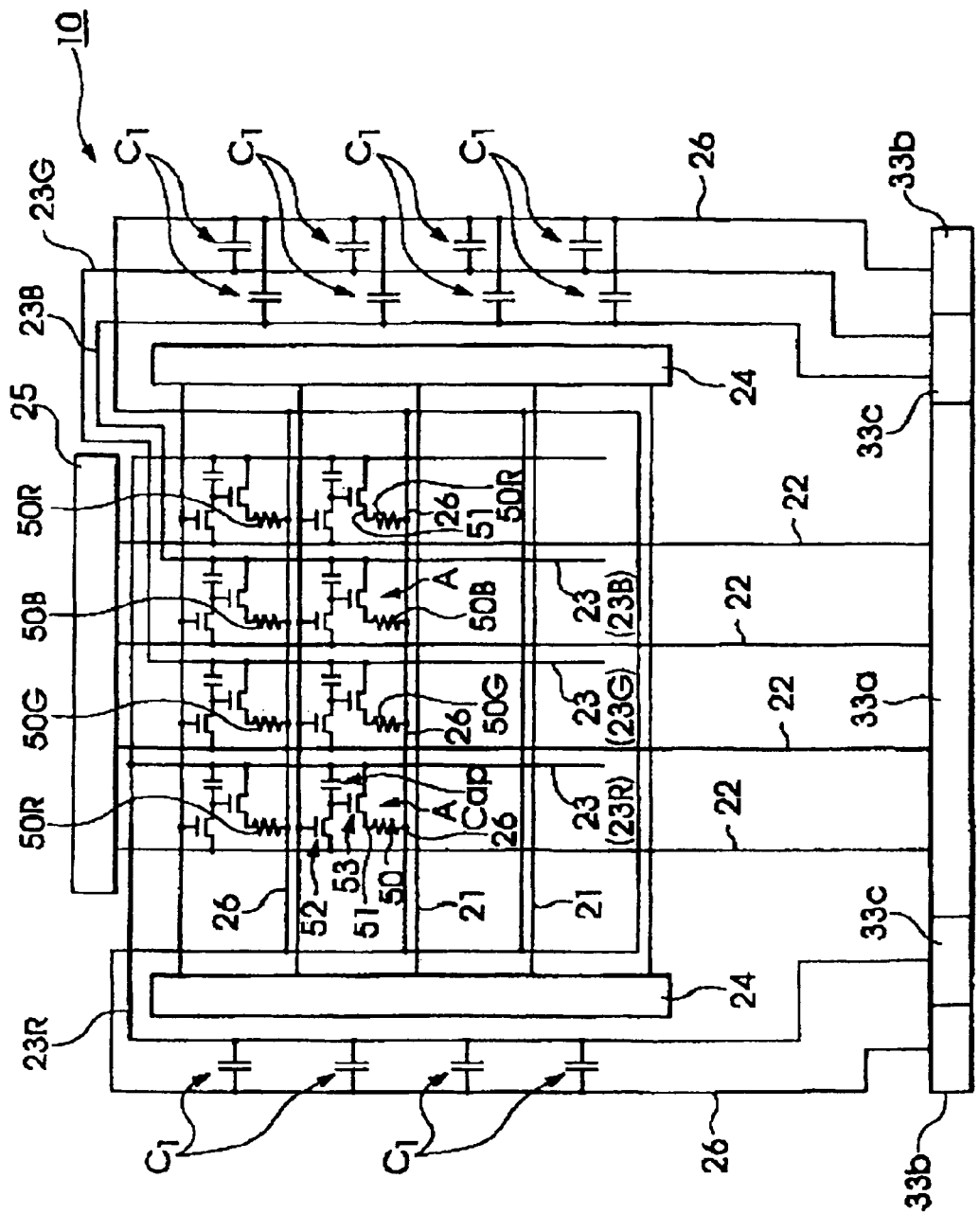
FIG. 3 is a schematic illustrating a wiring structure of an electro-optical device according to an exemplary embodiment of the present invention.

Next, a wiring structure of the electro-optical device 10 according to the present exemplary embodiment is described in detail. FIG. 3 is a schematic illustrating the wiring structure of the electro-optical device according to an exemplary embodiment of the present invention. As shown in FIG. 3, the electro-optical device 10 includes a plurality of scanning lines 21, a plurality of signal lines 22 extending in a direction in which the scanning lines 21 are intersected and a plurality of light-emitting power source wiring lines 23 extending in parallel to the arranged signal lines 22, respectively. A pixel region A is provided in each intersection of the scanning lines 21 and the signal lines 22.

A data line driving circuit 33a including shift registers, level shifters, video lines and analog switches are connected to each signal line 22. In addition, an inspection circuit 25 including thin film transistors is connected to each signal line 22. Furthermore, a scanning line driving circuit 24 including shift registers and level shifters is connected to each scanning line 21.

Furthermore, each of the pixel regions A is provided with a switching thin film transistor 52, a holding capacitor Cap, a current thin film transistor 53, a pixel electrode 51, a light-emitting layer 50 and a cathode 26. The switching thin film transistor 52 whose gate electrode is connected to the scanning line 21, is driven in accordance with scanning signals supplied from the scanning line 21 so as to be turned on or off. The holding capacitor Cap holds image signals supplied from the signal line 22 through the switching thin film transistor 52.

A gate electrode of the current thin film transistor 53 is connected to the switching thin film transistor 52 and the holding capacitor Cap, and the image signal held by the holding capacitor Cap is supplied to the gate electrode. The pixel electrode 51 is connected to the current thin film transistor 53, and when the pixel electrode is electrically connected to the light-emitting power source wiring line 23 through the current thin film transistor 53, the driving current flows into the pixel electrode from the light-emitting power source wiring line 23. The light-emitting layer 50 is sandwiched between the pixel electrode 51 and the cathode 26.

The light-emitting layer 50 includes three types of light-emitting elements; a light-emitting layer 50R emitting a red light, a light-emitting layer 50G emitting a green light and a light-emitting layer 50B emitting a blue light. The respective light-emitting layers 50R, 50G, 50B are arranged in striped shapes. In addition, light-emitting power source wiring lines 23R, 23G, 23B connected to the respective light-emitting layers 50R, 50G, 50B through the current thin film transistor 53 are connected to the light-emitting power source circuit 33c, respectively. The light-emitting power source wiring lines 23R, 23G, 23B are wired for every color, because the driving potentials of the light-emitting layers 50R, 50G, 50B are different for every color.

Furthermore, in the electro-optical device of the present embodiment, electrostatic capacitors $C_1$ are formed between the cathode 26 and the light-emitting power source wiring lines 23R, 23G, 23B. When the electro-optical device 10 is driven, electric charge is accumulated in the electrostatic capacitors $C_1$. When the potential of the driving current flowing through the respective light-emitting power source wiring lines 23 in the course of driving the electro-optical device 10 varies, the accumulated charge is discharged into the respective light-emitting power source wiring lines 23 to suppress the variation in driving current. Accordingly, the image display by the electro-optical device 10 can be normally maintained.

Furthermore, in this electro-optical device 10, when the scanning signals are supplied from the scanning lines 21 to turn on the switching thin film transistor 52, the potential of the signal lines 22 at that time is held at the holding capacitors Cap, and the ON/OFF state of the current thin film transistors 53 is determined in accordance with the potential held at the holding capacitors Cap. In addition, the driving current flows through channels of the current thin film transistors 53 from the light-emitting power source wiring lines 23R, 23G, 23B to the pixel electrodes 51, and current also flows through the light-emitting layers 50R, 50G, 50B to the cathode 26. At this time, a quantity of emitted light corresponding to the quantity of current flowing through the light-emitting layers 50 is obtained from the light-emitting layers 50.

Figure 4:
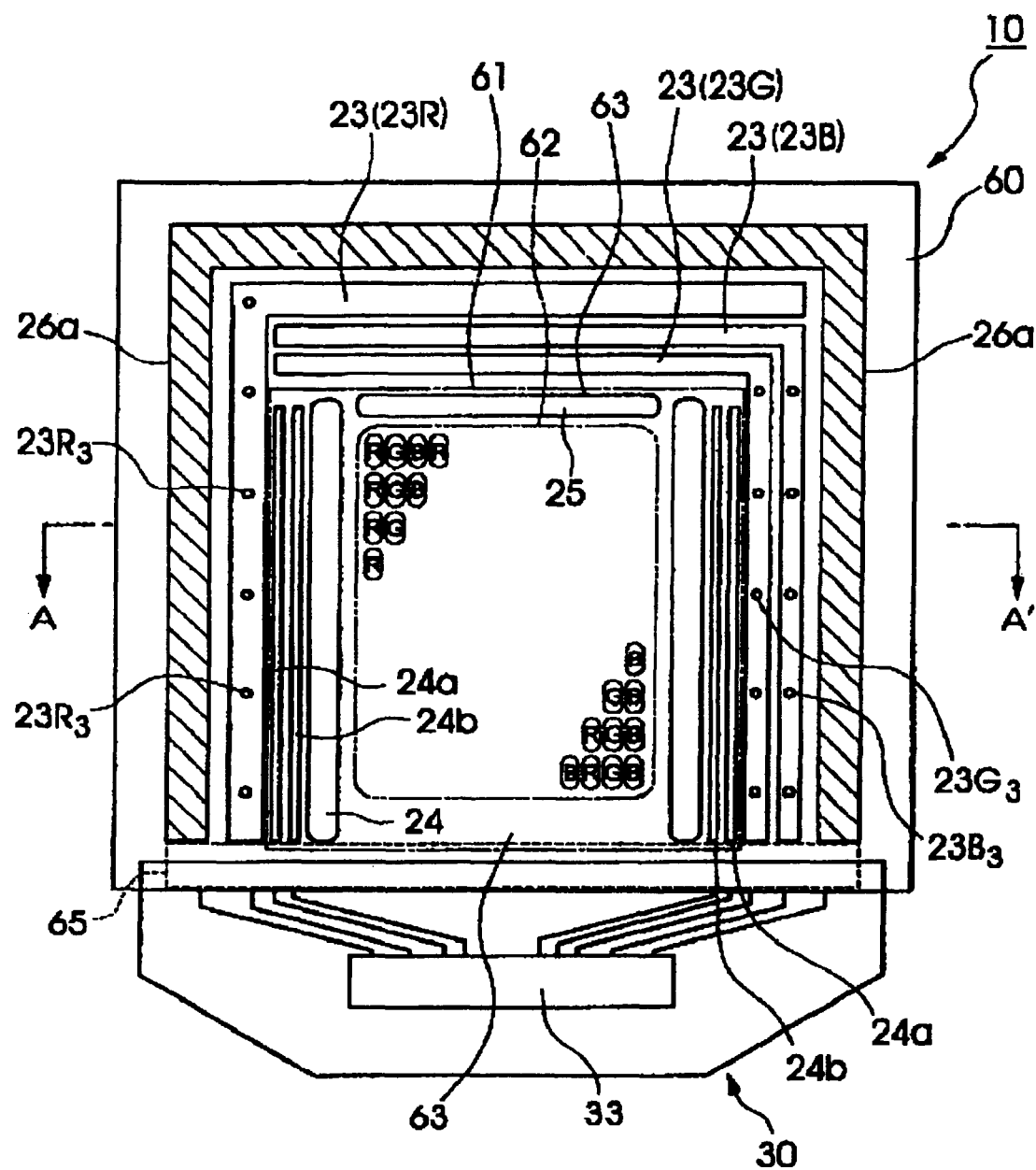
FIG. 4 is a schematic plan view of the electro-optical device of the present exemplary embodiment.
Figure 5:
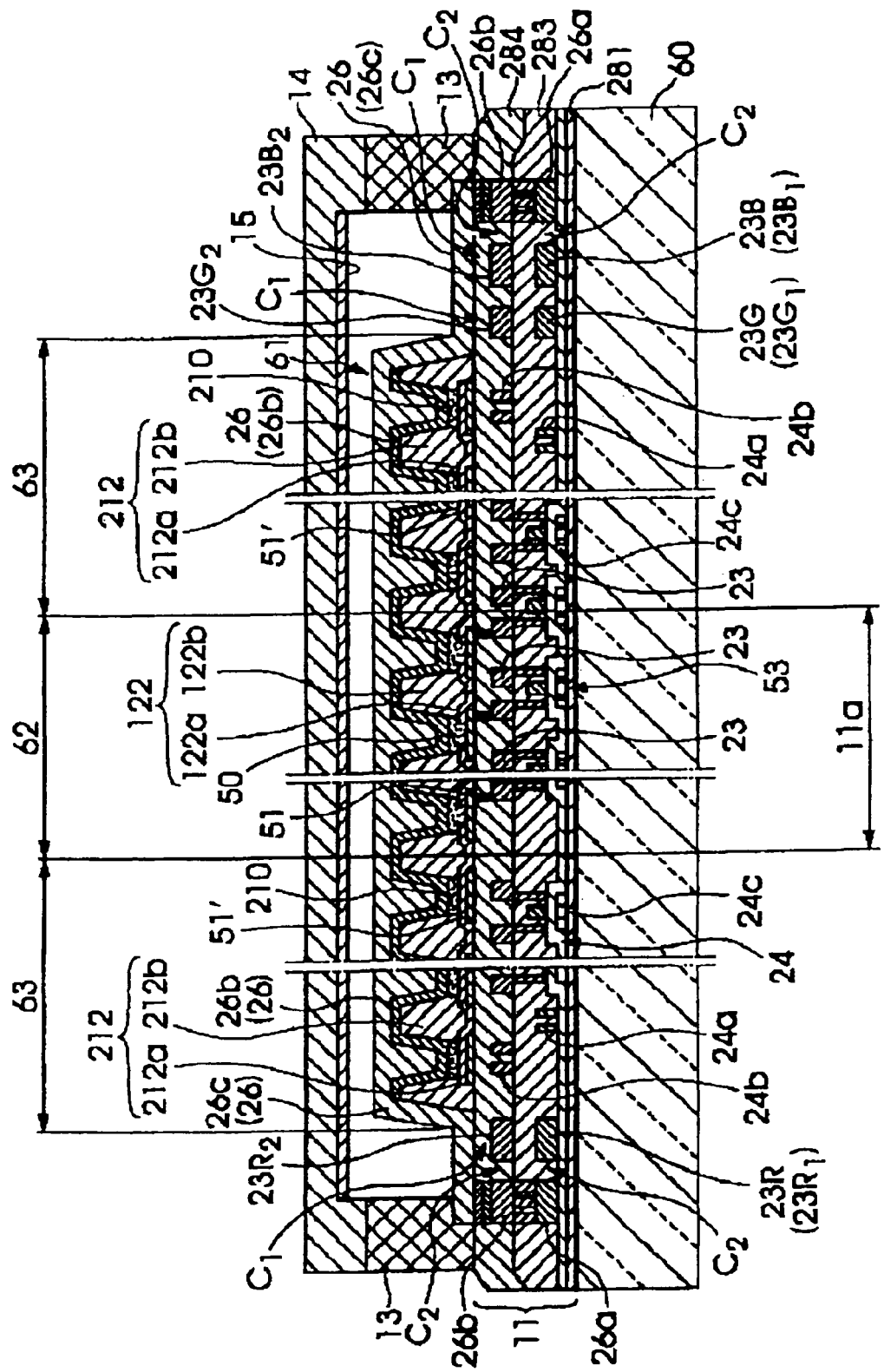
FIG. 5 is a cross-sectional view taken along plane A-A' in FIG. 4.

Next, a specific configuration of the electro-optical device 10 according to the present exemplary embodiment is described with reference to FIG. 4 and FIG. 5. FIG. 4 is a schematic plan view of the electro-optical device according to the present exemplary embodiment, and FIG. 5 is a cross-sectional view taken along plane A-A' in FIG. 4. As shown in FIG. 4, the electro-optical device 10 according to the present exemplary embodiment generally includes a substrate 60, a pixel electrode group region (not shown), light-emitting power source wiring lines 23 (23R, 23G, 23B) and a display pixel portion 61 (within a frame of a dashed line in the drawing).

The substrate 60 is a transparent substrate, for example, made of glass and the like. The pixel electrode group region is a region in which the pixel electrodes (not shown) connected to the current thin film transistors 53 shown in FIG. 3 are arranged in a matrix on the substrate 60. The light-emitting power source wiring lines 23 (23R, 23G, 23B) are arranged around the pixel electrode group region, as shown in FIG. 4, and are connected to the respective pixel electrodes. The display pixel portion 61 is positioned at least above the pixel electrode group region and has a substantially rectangular shape in a plan view. This display pixel portion 61 is divided into a substantial display region (or, may be referred to as an effective display region) 62 (within a frame indicated by a chain double-dashed line) at the center and a dummy region 63 disposed outside of the substantial display region 62 (a region between the dashed chain line and the chain double-dashed line).

Furthermore, the scanning line driving circuits 24 are disposed on both sides of the substantial display region 62 in the drawing. These scanning line driving circuits 24 are provided on the lower side (the substrate 60 side) of the dummy region 63. Furthermore, control signal wiring lines 24a for the scanning line driving circuit and power source wiring lines 24b for the scanning line driving circuit which are connected to the scanning line driving circuit 24 are provided on the lower side of the dummy region 63. Furthermore, the aforementioned inspection circuit 25 is disposed on the upper side of the substantial display region 62 in the drawing. This inspection circuit 25 is disposed on the lower side (the substrate side 2) of the dummy region 63, and it is possible to inspect the quality or the defect of the electro-optical device during its manufacture or during its shipment by using this inspection circuit 25.

As shown in FIG. 4, the light-emitting power source wiring lines 23R, 23G, 23B are disposed at the periphery of the dummy region 63. Each of the light-emitting power source wiring lines 23R, 23G, 23B extends along the control signal wiring lines 24a for scanning line driving circuit from the lower side of the substrate 60 in FIG. 2 to the upper side in FIG. 4, is bent from a position at which the control signal wiring lines 24a for the scanning line driving circuit are stopped, extends along the outside of the dummy region 63, and is connected to the pixel electrodes (not shown) in substantial display region 62. Further, a cathode wiring line 26a connected to the cathode 26 is formed on the substrate 60. This cathode wiring line 26a is formed substantially in a U-shape in a plan view to surround the light-emitting power source wiring lines 23R, 23G, 23B.

Next, as shown in FIG. 5, a circuit portion 11 is formed on the substrate 60, and a display pixel portion 61 is formed on the circuit portion 11. In addition, sealing material 13 surrounding the display pixel portion 61 in a ring shape is formed on the substrate 60, and a sealing substrate 14 is provided on the display pixel portion 61. The sealing substrate 14 is adhered to the substrate 60 through the sealing material 13, and is made of glass, metal, resin and the like. An absorbent 15 is adhered to the back surface of the sealing substrate 14 so that water or oxygen came to be mixed in a space between the display pixel portion 61 and the sealing substrate 14 can be adsorbed. Further, a getter may be used in place of the adsorbent 15. Furthermore, the sealing material 13 is made of, for example, thermosetting resin or UV curing resin, and it is preferable that the sealing material made of epoxy resin that is one type of thermosetting resin in particular.

The central portion of the circuit portion 11 is provided with a pixel electrode group region 11a. The pixel electrode group region 11a comprises the current thin film transistors 53 and the pixel electrodes 51 connected to the current thin film transistors 53. The current thin film transistors 53 are formed to be buried in a base protective layer 281, a second interlayer insulating layer 283 and a first interlayer insulating layer 284 which are stacked on the substrate 60, and the pixel electrodes 51 are formed on the first interlayer insulating layer 284. The light-emitting power source wiring lines 23 (23R, 23G, 23B) are connected to one side of electrodes (source electrodes) connected to the current thin film transistors 53 and formed on the second interlayer insulating film 283. In addition, although the holding capacitors Cap and the switching thin film transistors 52 are also formed on the circuit portion 11, these are not shown in FIG. 5. Furthermore, the signal lines 22 are not shown in FIG. 5.

Next, in FIG. 5, both sides of the pixel electrode group region 11a in the drawing are provided with the aforementioned scanning line driving circuit 24. The scanning line driving circuit 24 shown in FIG. 4 includes N channel type or P channel type thin film transistors 24c constituting inverters included in the shift registers, the thin film transistors 24c have the same structure as the aforementioned current thin film transistors 53, except that they are not connected to the pixel electrodes 51. Further, although the illustration of the inspection circuit 25 is omitted in FIG. 5, the inspection circuit 25 also includes thin film transistors, similarly. The thin film transistors included in the inspection circuit 25 have the same structure as the current thin film transistors 53, except that they are not connected to dummy pixel electrodes 51' which is described below.

As shown in FIG. 5, the control signal wiring lines 24a for the scanning line driving circuit are formed on the base protective layer 281 outside the scanning line driving circuit 24 in the drawing. In addition, the power source wiring lines 24b for the scanning line driving circuit are formed on the second interlayer insulating layer 283 outside the control signal wiring lines 24a for the scanning line driving circuit. Furthermore, the light-emitting power source wiring lines 23 are formed outside the power source wiring lines 24b for the scanning line driving circuit. The light-emitting power source wiring lines 23 employ a double wiring structure including two wiring lines and are arranged outside the display pixel portion 61 as described above. By employing the double wiring structure, it is possible to reduce the wiring line resistance.

For example, the light-emitting power source wiring line 23R for red color on the left side in FIG. 5 includes a first wiring line $23R_1$ formed on the base protective layer 281 and a second wiring line $23R_2$ formed on the first wiring line $23R_1$ through the second interlayer insulating film 283. The first wiring line $23R_1$ and the second wiring line $23R_2$ are connected to each other through a contact hole $23R_3$ penetrating the second interlayer insulating layer 283 as shown in FIG. 2. Like this, the first wiring line $23R_1$ is formed at the same level position as the cathode wiring line 26a and the second interlayer insulating layer 283 is disposed between the first wiring line $23R_1$, and the cathode wiring line 26a. Furthermore, as shown in FIG. 5, the cathode wiring line 26a is electrically connected to a cathode wiring line 26b formed on the second interlayer insulating layer 283 through a contact hole, and the cathode wiring line 26a also has the double wiring structure. Similarly, the second wiring line $23R_2$ is formed at the same level position as the cathode wiring line 26b, and the first interlayer insulating layer 284 is disposed between the first wiring line $23R_2$ and the cathode wiring line 26b. By constituting such structure, second electrostatic capacitors $C_2$ are formed between the first wiring line $23R_1$ and the cathode wiring line 26a and between the second wiring line $23R_2$ and the cathode wiring line 26b.

Similarly, the light-emitting power source wiring lines 23G, 23B for green color and blue color on the right side in FIG. 5 also employ the double wiring structure. The light-emitting power source wiring lines 23G, 23B include first wiring lines $23G_1$, $23B_1$ which are formed on the base protective layer 281 and second wiring lines $23G_2$, $23B_2$ which are formed on the second interlayer insulating layer 283, respectively. The first wiring lines $23G_1$, $23B_1$ and the second wiring lines $23G_2$, $23B_2$ are connected to each other through contact holes $23G_3$, $23B_3$ penetrating the second interlayer insulating layer 283 as shown in FIG. 4. In addition, the second electrostatic capacitors $C_2$ are formed between the first wiring line $23B_1$ for blue color and the cathode wiring line 26a and between the second wiring line $23B_2$ for blue color and the cathode wiring line 26b.

It is preferable for the gap between the first wiring line $23R_1$ and the second wiring line $23R_2$ to be, for example, within a range of 0.6 to 1.0 μm. If the gap is less than 0.6 μm, the parasitic capacitance between the source metal and the gate metal having potentials different from the signal lines 22 and the scanning lines 21 is increased, it is not preferable for the gap to be less than 0.6 μm. For example, many locations where the source metal and the gate metal intersect each other are in the substantial display region 62, and if the parasitic capacitance at such locations becomes large, it may undesirably cause the time delay of the image signal. As a result, the image signals cannot be written to the pixel electrodes 51 within a predetermined time, which causes deterioration of contrast. It is preferable that the second interlayer insulating layer 283 sandwiched between the first wiring line $23R_1$ and the second wiring line $23R_2$ is made of, for example, $SiO_2$ and the like. However if the second interlayer insulating layer 283 is formed to be 1.0 μm or more thick, it may cause undesirably destruction of the substrate 60 due to stress of $SiO_2$.

In addition, the cathode 26 extending from the display pixel portion 61 is formed on the upper side of the respective light-emitting power source wiring lines 23R. In this regard, the second wiring line $23R_2$ of the respective light-emitting power source wiring lines 23R is disposed to face the cathode 26 with the first interlayer insulating layer 284 sandwiched therebetween, and as a result, the aforementioned first electrostatic capacitor $C_1$ is formed between the second wiring line $23R_2$ and the cathode 26. Here, it is preferable that the gap between the second wiring line $23R_2$ and the cathode 26 is, for example, within a range of 0.6 to 1.0 μm. If the gap is less than 0.6 μm, the parasitic capacitance increases between the pixel electrodes and the source metal having different potentials such as the pixel electrodes and the source metal, which causes the wiring line delay in the signal lines employing the source metal. As a result, the image signals cannot be written within a predetermined time, which causes deterioration of contrast. It is preferable that the first interlayer insulating layer 284 sandwiched between the second wiring line $23R_2$ and the cathode 26 is made of, for example, $SiO_2$, acryl resin and the like. However, if $SiO_2$ is formed to be 1.0 μm thick or more, the substrate 60 may be destructed due to stress. Furthermore, the acryl resin can be formed to be about 2.0 μm thick, but since the acryl resin has a property to expand by adsorbing water, the pixel electrodes formed thereon may be destroyed undesirably.

Like this, in the display substrate 20, since the first electrostatic capacitor $C_1$ is provided between the light-emitting power source wiring lines 23 and the cathode 26, when the potential of the driving current flowing through the light-emitting power source wiring lines 23 varies, the electric charge accumulated in the first electrostatic capacitor $C_1$ is supplied to the light-emitting power source wiring lines 23 and the lack of potential of the driving current can be complemented by the electric charge to suppress the variation of potential. Accordingly, it is possible to normally maintain the image display of the light-emitting device 1. Specifically, since the light-emitting power source wiring lines 23 and the cathode 26 are opposite to each other outside the display pixel portion 61, the gap between the light-emitting power source wiring lines 23 and the cathode 26 can be made smaller to increase the quantity of charge accumulated in the first electrostatic capacitor $C_1$, and the variation in potential of the driving current can be made smaller to stably perform the image display. Furthermore, the light-emitting power source wiring lines 23 have the double wiring structure including the first wiring lines and the second wiring lines and the second electrostatic capacitor $C_2$ is provided between the first wiring lines and the cathode wiring line, so that the charge accumulated in the second electrostatic capacitors $C_2$ is also supplied to the light-emitting power source wiring lines 23. Therefore, it is possible to suppress the variation in potential and it is also possible to more stably maintain the image display of the light-emitting device 1.

Next, light-emitting layers 50 and bank portions (insulating portions) 122 are formed in the substantial pixel region 62 of the display pixel portion 61. The light-emitting layer 50 is stacked on each of the pixel electrodes 51 as shown in FIG. 5. In addition, the bank portions 122 are provided between each of the pixel electrodes 51 and each of the light-emitting layers 50 to define each of the light-emitting layers 50. The bank portion 122 include a stacked structure of an inorganic bank layer 122a positioned close to the substrate 60 and an organic bank layer 122b positioned away from the substrate 60. Further, a light-shielding layer may be disposed between the inorganic bank layer 122a and the organic bank layer 122b.

The inorganic and organic bank layers 122a, 122b are formed to extend onto the edge portion of the pixel electrodes 51, and the inorganic bank layers 122a are formed to extend more toward the centers of the pixel electrodes 51 than the organic bank layers 122b. Further, it is preferable that the inorganic bank layers 122a be made of inorganic material such as, for example, $SiO_2$, $TiO_2$, or SiN. Furthermore, the film thickness of the inorganic bank layers 122a is preferably within a range of 50 to 200 nm and more preferably 150 nm. When the film thickness is less than 50 nm, since the inorganic bank layers 122a become thinner than a hole injecting/carrying layer which is described below, and thus the planarity of the hole injecting/carrying layer cannot be ensured, it is not preferable. Furthermore, when the film thickness is more than 200 nm, since the step height due to the inorganic bank layers 122a increases and thus the planarity of the light-emitting layer (which is described below) stacked on the hole injecting/carrying layer cannot be ensured. Hence, it is not preferable that the film thickness be more than 200 nm.

Furthermore, the organic bank layers 122b are made of general resists, such as acryl resin or polyimide resin. The thickness of the organic bank layers 122b is preferably within a range of 0.1 to 3.5 μm and more preferably about 2 μm. If the thickness is less than 0.1 μm, since the thickness of the organic bank layers 122b is thinner than the total thickness of the hole injecting/carrying layer and the light-emitting layer and the light-emitting layer may overflow undesirably from an upper opening, it is not preferable. Furthermore, if the thickness exceeds 3.5 μm, the step height due to the upper opening portion increases, and thus the step coverage of the cathode 26 formed on the organic bank layers 122b cannot be ensured, which is not preferable. Furthermore, when the thickness of the organic bank layers 122b is 2 μm or more, the insulation between the cathode 26 and the pixel electrodes 51 can be enhanced, which is preferable.

In this regard, the light-emitting layers 50 are formed to be thinner than the bank portions 122.

Furthermore, regions having a lyophilic property and regions having a lyophobic property are formed around the bank portions 122. The regions having a lyophilic property are the inorganic bank layers 122a and the pixel electrodes 51, and lyophilic radicals such as hydroxyl radicals are introduced into these regions by plasma treatment using oxygen as a reaction gas. Furthermore, the regions having a lyophobic property are the organic bank layers 122b, and lyophobic radicals such as fluorine are introduced by plasma treatment using 4-fluoromethane as a reaction gas.

The light-emitting layers 50 are stacked on the hole injecting/carrying layers (not shown) stacked on the pixel electrodes 51. In addition, in the present specification, a constitution including the light-emitting layers 50 and the hole injecting/carrying layers is referred to as a functional layer, and a constitution including the pixel electrodes 51, the functional layer and the cathode 26 is referred to as a light-emitting element. The hole injecting/carrying layers have a function of injecting holes into the light-emitting layers 50 and also a function of carrying the holes in the hole injecting/carrying layers. By providing these hole injecting/carrying layers between the pixel electrodes 51 and the light-emitting layers 50, the characteristics of the element such as light emitting efficiency or life time of the light-emitting layers 50 are improved. In addition, in the light-emitting layers 50, the holes injected from the hole injecting/carrying layers and electrons from the cathode 26 are coupled to generate a fluorescent light. The light-emitting layers 50 have three types of light-emitting layers; a light-emitting layers to emit a red (R) light, a light-emitting layer to emit a green (G) light and a light-emitting layer to emit a blue (B) light, and as shown in FIG. 3 and FIG. 4, the respective light-emitting layers are arranged in a striped shape.

Next, as shown in FIG. 5, dummy light-emitting layers 210 and dummy bank portions 212 are formed in the dummy region 63 of the display pixel portion 61. The dummy bank portion 212 has a stacked structure of dummy inorganic bank layers 212a positioned close to the substrate 60 and dummy organic bank layers 212b positioned away from the substrate 60. The dummy inorganic bank layers 212a are formed on the whole surface of the dummy pixel electrodes 51'. Furthermore, the dummy organic bank layers 212b are formed between the pixel electrodes 51, similar to the organic bank layers 122b. In addition, the dummy light-emitting layers 210 are formed on the dummy pixel electrodes 51' through the dummy inorganic bank layers 212a.

The dummy inorganic bank layers 212a and the dummy organic bank layers 211b are made of the same material as the aforementioned inorganic and organic bank layers 122a, 122b, and have the same film thickness as the aforementioned inorganic and organic bank layers 122a, 122b. Furthermore, the dummy light-emitting layers 210 are stacked on the dummy hole injecting/carrying layers (not shown), and the materials or the film thickness of the dummy hole injecting/carrying layers and the dummy light-emitting layers is the same as that of the aforementioned hole injecting/carrying layers and the light-emitting layers 50. Therefore, similar to the aforementioned light-emitting layers 50, the dummy light-emitting layers 210 are formed to be thinner than the dummy bank portions 212.

By disposing the dummy region 63 around the substantial display region 62, it is possible to make the uniform thickness of the light-emitting layers 50 in the substantial display region 62. Thus it is possible to reduce or suppress the non-uniformity of display. That is, by disposing the dummy region 63, it is possible to make the uniform drying condition of ink composition ejected in forming a display element using the inkjet method in the substantial display region 62, it is unnecessary to be concerned with deviation in thickness of the light-emitting layers 50 being rendered in the edge portions of the substantial display region 62.

Next, the cathode 26 is formed on the whole surfaces of the substantial display region 62 and the dummy region 63, extends onto the substrate 60 outside the dummy region 63, and is disposed to face the light-emitting power source wiring lines 23 outside the dummy region 63, that is, outside the display pixel portion 61. In addition, an end of the cathode 26 is connected to the cathode wiring line 26a formed in the circuit portion 11. The cathode 26 makes a current flow in the light-emitting layers 50 as electrodes opposite to the pixel electrodes 51. This cathode 26 has a stacked structure of a reflecting layer 26c and a cathode layer 26b, which is made of, for example, a stacked body of lithium fluoride and calcium. In the cathode 26, only the reflecting layer 26c extends to the outside of the display pixel portion 61. Since the reflecting layer 26c reflects the light emitted from the light-emitting layers 50 toward the substrate 60, it is preferable that the reflecting layer 26c is made of, for example, Al, Ag, Mg/Ag stacked body, etc. Furthermore, an oxidation-preventing protective layer made of $SiO_2$, SiN, etc. may be formed on the reflecting layer 26c.

Figure 6:
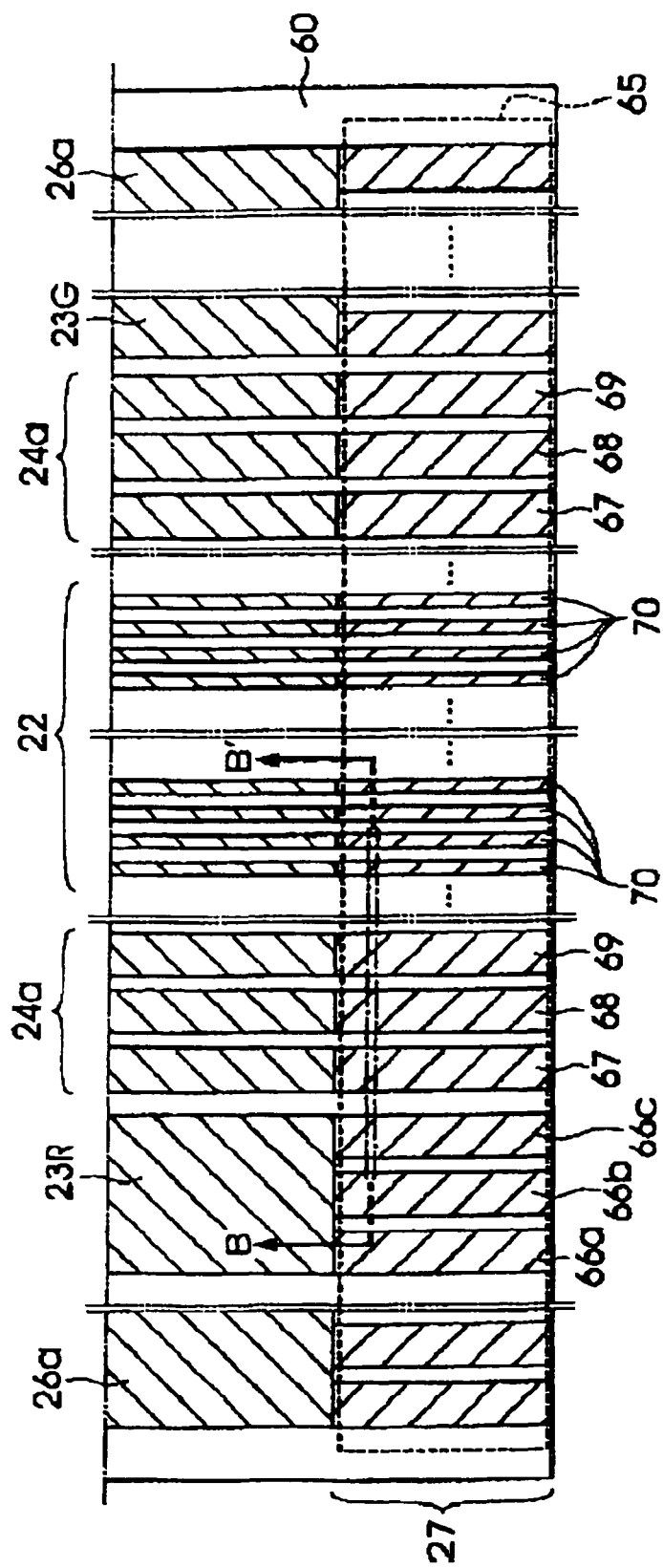
FIG. 6 is a top view of peripheries of a fixing portion 65 shown in FIG. 4.

Furthermore, as shown in FIG. 4, the relay substrate 30 is fixed to an end of the substrate 60 using the aforementioned anisotropic conductive film 40. In addition, the data line driving circuit 33a, the cathode power source circuit 33b and the light-emitting power source circuit 33c shown in FIG. 3 are built in the semiconductor chip 33 mounted on the relay substrate 30. A portion surrounded with a dotted line in FIG. 4 indicates a fixing portion of the display substrate 20 and the relay substrate 30. FIG. 6 is a top view around of the fixing portion 65 shown in FIG. 4. In addition, the anisotropic conductive film 40 and the relay substrate 30 are not shown in FIG. 6.

As shown in FIG. 6, the external connection terminals are formed in the fixing portion 65. As the external connection terminals, a first external connection terminal having substantially the same width as the line width is provided for each wiring line with a narrow line width, and a plurality of second external connection terminals having thinner width than the line width is provided for each wiring line with a wide line width. For example, for each of the control signal wiring lines 24a for the scanning line driving circuit with a narrow line width, the first external connection terminals 67, 68, 69 having substantially the same width as the line width of the control signal wiring lines 24a for the scanning line driving circuit are provided. On the other hand, the second external connection terminals 66a, 66b, 66c having thinner width than the line width of the light-emitting power source wiring line 24R are provided for the light-emitting power source wiring line 23R with a wide line width. Furthermore, the second external connection terminals 70 with the same line width as the signal lines 22 are provided for the signal lines 22 having thinner width than that of the control signal wiring lines 24a for the scanning line driving circuit. Furthermore, the numbers of the first external connection terminals and the second external connection terminals are properly set up in accordance with the line widths of wiring lines formed on the substrate 60.

In this way, the numbers of the first external connection terminals and the second external connection terminals are changed in accordance with the line width of wiring line formed on the substrate 60 in order to make the pressing condition be as equal as possible all over the fixing portion 65. That is, as described in conjunction with FIG. 1 and FIG. 2, the display substrate 10 and the relay substrate 20 are fixed by using the anisotropic conductive film 40, but if the fixing conditions (for example, a width of terminal, an adhering area, a state when the pressure is applied, etc) are different, the electrical resistance in the fixing portion 65 varies in accordance with positions. If the electrical resistance in the fixing portion 65 varies in accordance with its positions, defects in display such as non-uniformity of display and deterioration of contrast occur. For this reason, in the fixing portion 65, by changing the number of external connection terminals in accordance with the line widths of wiring lines formed on the substrate 60, the pressing conditions are made as equal as possible to each other. Furthermore, by providing a plurality of external connection terminals, the adhering area can be enlarged. That is, since the anisotropic conductive film can be disposed between the plurality of external connection terminals. And thus firm adhesion can be obtained.

Figure 7:
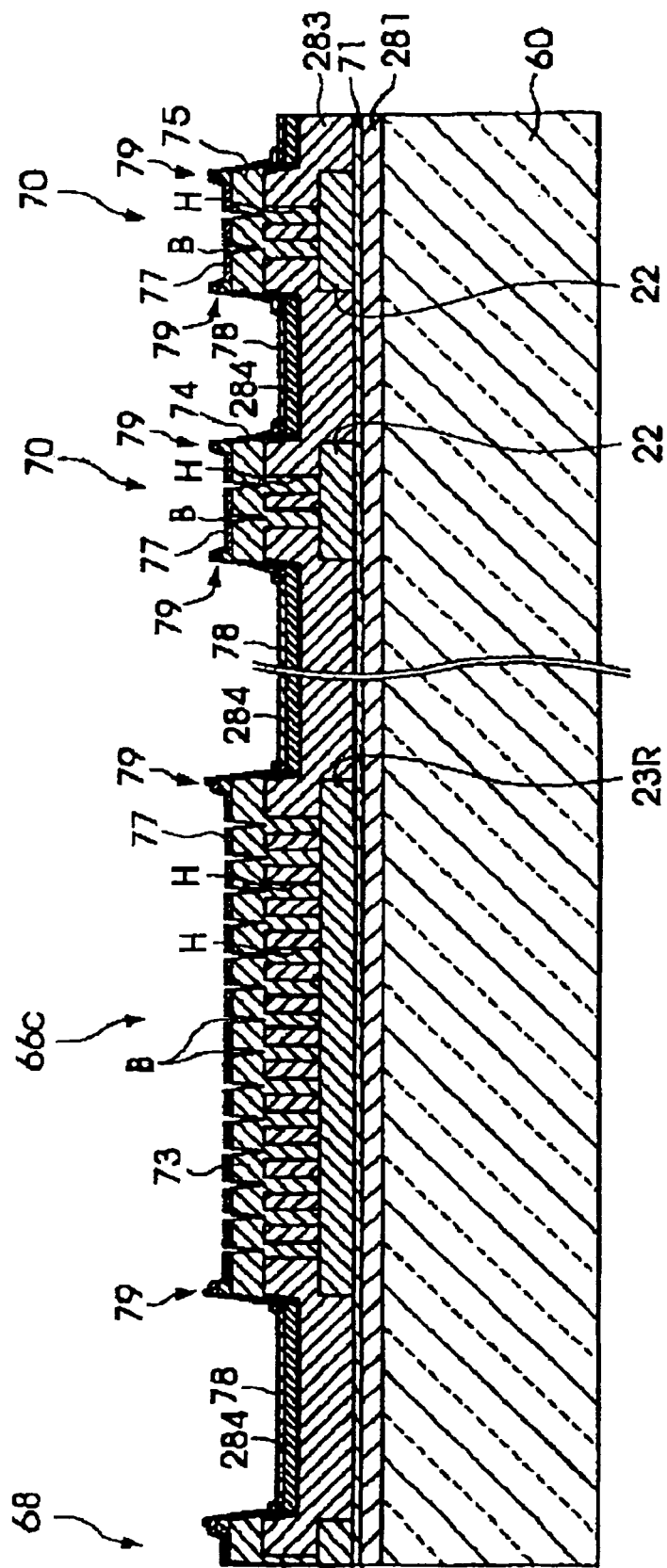
FIG. 7 is a cross-sectional view of a second external connection terminal 66c and a second external connection terminal 70 taken along plane B-B' in FIG. 6.
Figure 8:
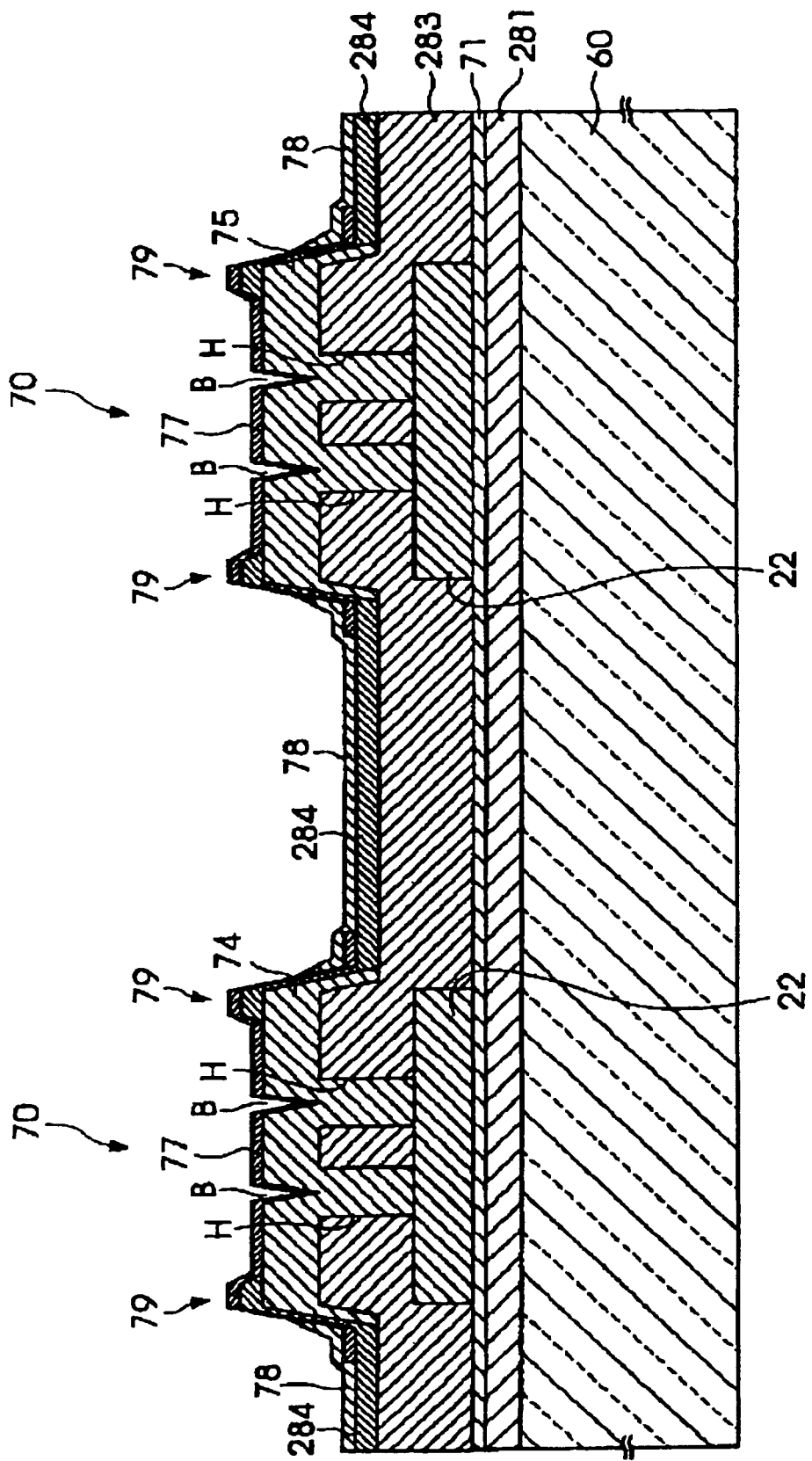
FIG. 8 is an enlarged schematic of the external connection terminal 70 in FIG. 7.

Next, a structure of the external connection terminals formed in the fixing portion 65 is described in detail below. FIG. 7 is a cross-sectional view of the second external connection terminal 66c and the second external connection terminal 70 taken along plane B-B' in FIG. 6, and FIG. 8 is an enlarged view of the external connection terminal 70 in FIG. 7. As shown in FIG. 7 and FIG. 8, the base protective layer 281 is formed on the substrate 60, and a gate insulating layer 71 having $SiO_2$ and/or SiN as a main component is formed on the base protective layer 281. This gate insulating layer 71 is formed to electrically insulate channel regions of the thin film transistors not shown from the gate electrodes. In addition, in the present specification, the "main component" means a component having the highest content ratio.

The signal lines 22 and the light-emitting power source wiring lines 23R are formed on the gate insulating layer 71, and the second interlayer insulating layer 283 is formed on the signal lines 22 and the light-emitting power source wiring lines 23R. In addition, the light-emitting power source wiring lines 23 and the control signal wiring line 24a for scanning line driving circuit are formed at the same time as the scanning lines 21 shown in FIG. 3.

In the second interlayer insulating layer 283, a plurality of contact holes are formed in the upper positions of the signal lines 22 and the light-emitting power source wiring lines 23R. In addition, the electrodes 73 are formed on the second interlayer insulating layer 283 above the light-emitting power source wiring lines 23R, and the electrodes 74, 75 are formed on the second interlayer insulating layer 283 above the signal lines 22.

Since these electrodes 73, 74, 75 are formed by using a sputtering method or the like after forming the contact holes H, concave portions B are formed in accordance with the quantity of metal material deposited in the contact holes H on the upper surfaces of the contact holes H. In this regard, through the contact holes H, the electrical communication between the light-emitting power source wiring lines 23R covered with the second interlayer insulating layer 283 and the electrodes 74 formed on the second interlayer insulating layer 283 and the electrical communication between the signal lines 22 covered with the second interlayer insulating layers 283 and the electrodes 74, 75 formed on the second interlayer insulating layer 283 are established.

Furthermore, in the side portions and in end portions of the electrodes 73, 74, 75 formed on the second interlayer insulating layer 283 and between the electrodes 73, 74, 75, the first interlayer insulating layer 284 made of inorganic material such as SiN for the purpose of electrical insulation is formed. Transparent electrodes 77 made of ITO and the like are formed in the upper portions, in the side portions and in the periphery portions of the electrodes 73, 74, 75, and protective layers 78 made of $SiO_2$ are formed between the transparent electrode 77 formed in the periphery portion of the electrodes 73, 74, 75 and the second external connection terminals 66c, 70, 70. Furthermore, the electrodes 73, 74, 75 are formed at the same time as the gate lines shown in FIG. 3, and the transparent electrode 77 is formed out of ITO at the same time as the pixel electrodes (anodes). At that time, the material such as ITO is formed by using the sputtering method and the like.

Figure 9:
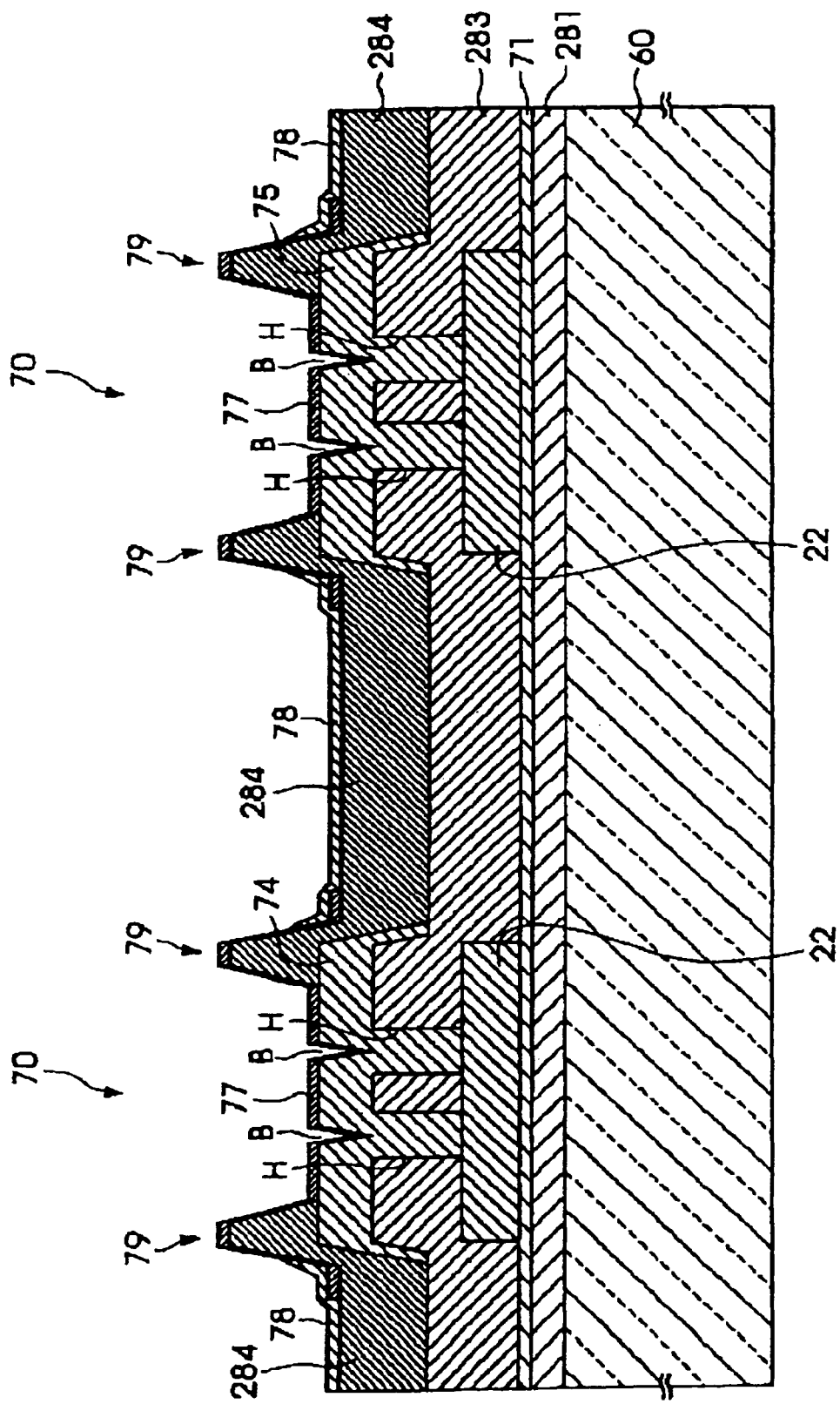
FIG. 9 is an enlarged schematic of the second external connection terminals 70, 70 in which first interlayer insulating layer 284 is formed to be thick.

Unlike this method, by applying a liquid material containing a conductive material by using the inkjet method, it is possible to form a metal layer on the uppermost surface of the external connection terminals. Further, as shown in FIG. 9 and the like, since the external connection terminals comprise a plurality of conductive layers, this technique can be applied to at least one layer of the plurality of conductive layers, not limited to the uppermost surface in the aforementioned example, and in addition, it is possible to form all the layers by using the inkjet method.

In this example, a dispersion solution (a liquid state material) obtained by dispersing conductive particles in a dispersion medium is used as the liquid material for the conductive film formation, and it is not important whether it is water based or oil based. The conductive fine particles used here are conductive polymer or superconductor fine particles in addition to metal fine particles containing at least one kind among gold, silver, copper, palladium and nickel. These conductive fine particles may be used after coating the organic material and the like on the surface thereof, in order to improve the dispersibility. The coating material for coating the surface of the conductive fine particles may include an organic solvent such as xylene or toluene, and citric acid and the like.

It is preferable that the diameter of the conductive fine particles is 1 nm or more and 0.1 μm or less. Specifically, it is more preferable that the particle diameter be 5 nm or more and 0.1 μm or less. If the particle diameter is more than 0.1 μm, nozzles of a liquid droplet ejecting head may be blocked undesirably. On the other hand, if the particle diameter is less than 5 nm, the volume ratio of the coating material to the conductive particles becomes greater, and thus the ratio of organic material in the obtained film becomes too great.

It is preferable that a dispersion medium whose vapor pressure is 0.001 mmHg or more and 200 mmHg or less (about 0.133 Pa or more and 26600 Pa or less) at the room temperature is used as the dispersion medium of the solution containing the conductive particles. If the vapor pressure is higher than 200 mmHg, the dispersion medium is vaporized rapidly after ejected and thus it is difficult to form a good film. In addition, it is more preferable that the vapor pressure of the dispersion medium is 0.001 mmHg or more and 50 mmHg or less (about 0.133 Pa or more and 6650 Pa or less). If the vapor pressure is more than 50 mmHg, the blocking of nozzles due to a rapid dry can occur easily when ejecting the liquid droplets by using the inkjet method. On the other hand, if the vapor pressure of the dispersion medium at the room temperature is less than 0.001 mmHg, the dispersion medium dries slowly and can easily remain in the film. Thus, it is difficult to obtain a good conductive film after a heat/light treatment that is a subsequent process.

The dispersion medium is not specifically limited, only if it can disperse the aforementioned conductive fine particles and does not cause aggregation. For example, in addition to water, alcohols such as methanol, ethanol, propanol, butanol, etc., hydrocarbon-based compounds such as n-heptane, n-octane, decane, toluene, xylene, cimen, durene, inden, dipentene, tetrahydronaphthalene, decahydronaphthalene, cyclohexylbenzene, etc., ether-based compounds such as ethyleneglycoldimethylether, ethyleneglycoldiethylether, ethyleneglycolmethylethylether, diethyleneglycoldimethyletheer, diehyleneglycoldiethylether, diethyleneglycolmethylethylether, 1,2-dimethoxyehtane, bis(2-methoxyethyl)ether, p-dioxane, and polar compounds such as prophylene carbonate, γ-buthylolactone, N-methyl-2-pyrrolidone, dimethylformamide, dimethylsulphoxide, cyclohexanone can be exemplified as a dispersion medium. Among these, in view of dispersibility of fine particles, stability of dispersion solution and facilitation of application to the inkjet method, it is preferable that water, alcohols, hydrocarbon-based compounds and ether-based compounds be used as the dispersion medium, and it is more preferable that water or hydrocarbon-based compounds is used as the dispersion medium. These dispersion mediums may be used separately or in a mixture of two kinds or more.

It is preferable that the concentration of the dispersion solute when the conductive fine particles are dispersed in the dispersion medium be 1 mass % or more and 80 mass % or less, and be adjusted in accordance with the film thickness of a desired conductive film. Further, when the concentration exceeds 80 mass %, the aggregation is apt to occur which makes it difficult to obtain a uniform film.

It is preferable that the surface tension of the dispersion solution of the conductive fine particles be within range of 0.02 N/m or more and 0.07 N/m or less. When the surface tension in ejecting liquid by using the inkjet method is less than 0.02 N/m, since the wettability of the ink compositions to the nozzle surfaces increases, the fly bending can easily occur. When the surface tension exceed 0.07 N/m, since the shape of meniscus at the front ends of the nozzles is not stable, it is difficult to control the quantity of ejection or the ejection timing.

In order to control the surface tension, a small amount of control agent for surface tension such as fluorine-based, silicon-based, or non-ionic compound may be added to the dispersion solution within a range where the contact angle with the substrate is not largely decreased. The non-ionic control agent for surface tension enhances the wettability of liquid to the substrate and improves a leveling property of film, thereby to help reduce or prevent fine unevenness from occurring in the film. The dispersion solution may contain organic compounds such as alcohol, ether, ester or ketone, as needed.

It is preferable that the viscosity of the dispersion solution be 1 mPa·s or more and 50 mPa·s or less. When the liquid material is ejected as liquid droplets using the inkjet method, if the viscosity is less than 1 mPa·s, the periphery portion of nozzles can be easily contaminated with flowing liquid, but if the viscosity is more than 50 mPa·s, the frequency of blocking in the nozzle holes increase, so that it is difficult to eject the liquid droplets smoothly.

Examples of using gold particles are described below.

To a gold particle dispersion solution (product name "Perfect Gold" made by Vacuum Metallurgy Co.) in which gold particles having a diameter of 10 nm are dispersed in toluene, xylene is added to obtain a liquid having a viscosity of 3 cp. Then, the aforementioned liquid is applied to regions (flat portions of terminals) formed between the convex portions using the inkjet method. Then, a metal thin film made of gold is formed on the flat portions of terminal portions and at least the flat surfaces portions of the convex portions.

Figure 14:
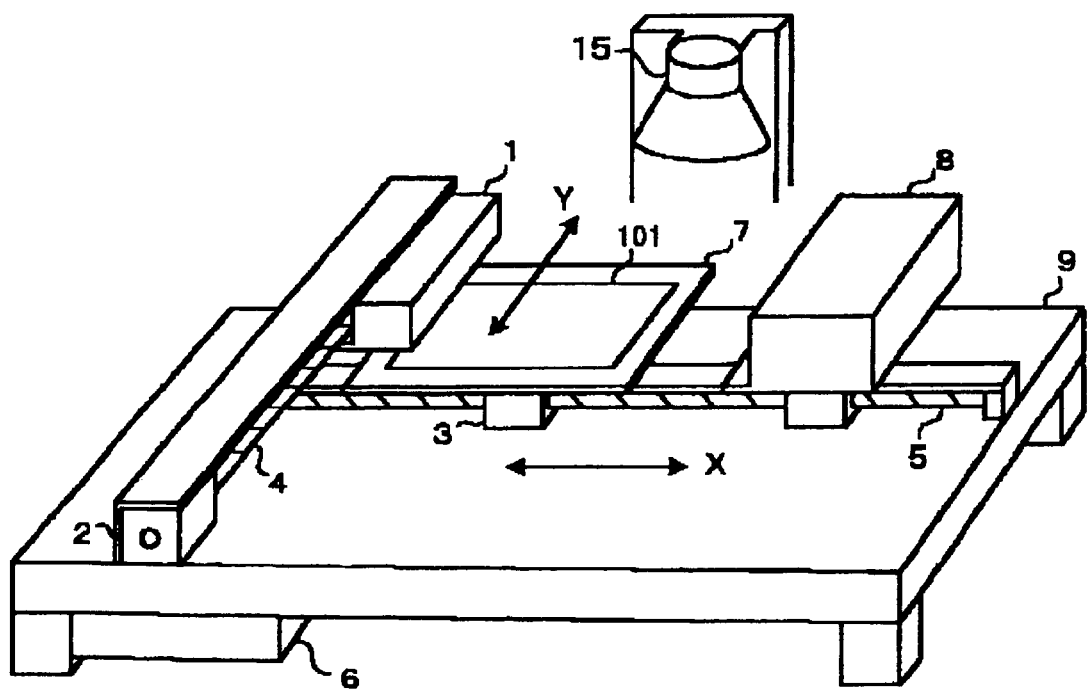
FIG. 14 is a schematic illustrating a structure of an application apparatus.

As an inkjet apparatus (may be referred to as a liquid applying apparatus) used in the inkjet method, the apparatus, for example, shown in FIG. 14 can be used.

The inkjet apparatus comprises an inkjet head group 1, an X axial driving shaft 4, a Y axial guide shaft 5, a control unit 6, a mounting support 7, a cleaning mechanism 8, a base 9, and a heater 15.

Figure 15:
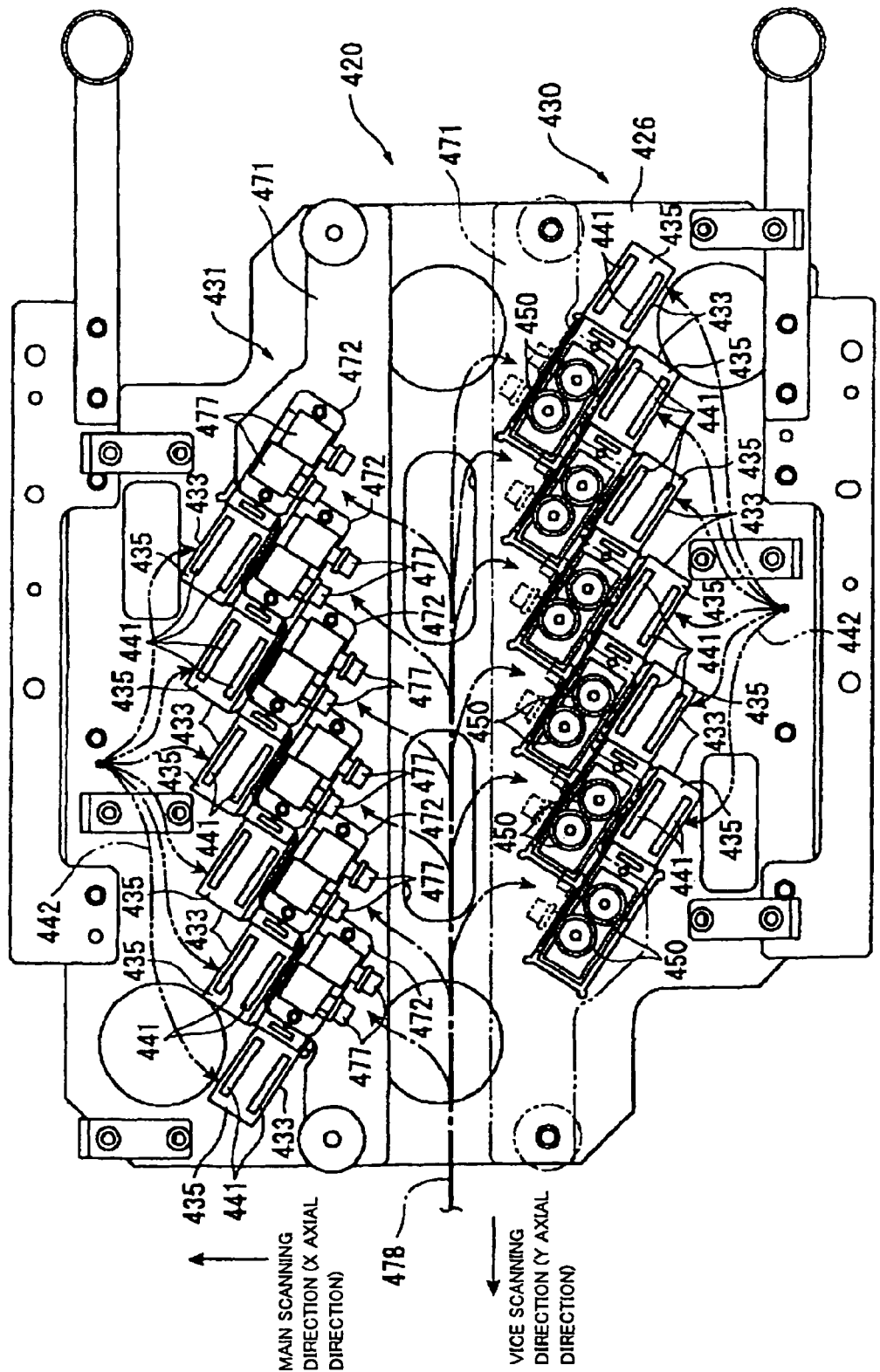
FIG. 15 is a plan view illustrating a head unit.

The inkjet head group comprises heads as inkjet applying means to eject a liquid containing predetermined conductive fine particles from the nozzles (ejecting side) and to apply it to a substrate at a predetermined interval. In the head group, a plurality of heads having a plurality of nozzles are formed. This head group in which the plurality of heads are arranged is constructed in the layout as shown in FIG. 15. That is, the respective heads are arranged to be inclined with respect to the scanning direction of the heads.

As shown in the drawing, a plurality of inkjet heads are provided in the inkjet apparatus. The plurality of inkjet heads are arranged to be inclined in the direction with which the scanning direction is intersected, and then the drawing using the inkjet can be executed. For example, by inclining the inkjet heads at 30° with respect to the scanning direction, the drawing by the inkjet apparatus is possible. By inclining the inkjet heads in the direction with which the scanning direction is intersected, the following advantages are obtained.

That is, when a pattern gap is narrow, by inclining the heads, the nozzle gap is made visually narrow. In this regard, it is possible to execute the drawing of narrow pitch pattern, and by varying the inclining angle, any pattern can be formed. In addition, in this case, the inkjet apparatus has a function in which the inkjet heads can be varied and adjusted at desired angles.

The inkjet heads and units are described in detail below.
[Constitution of Head Unit]

Figure 26:
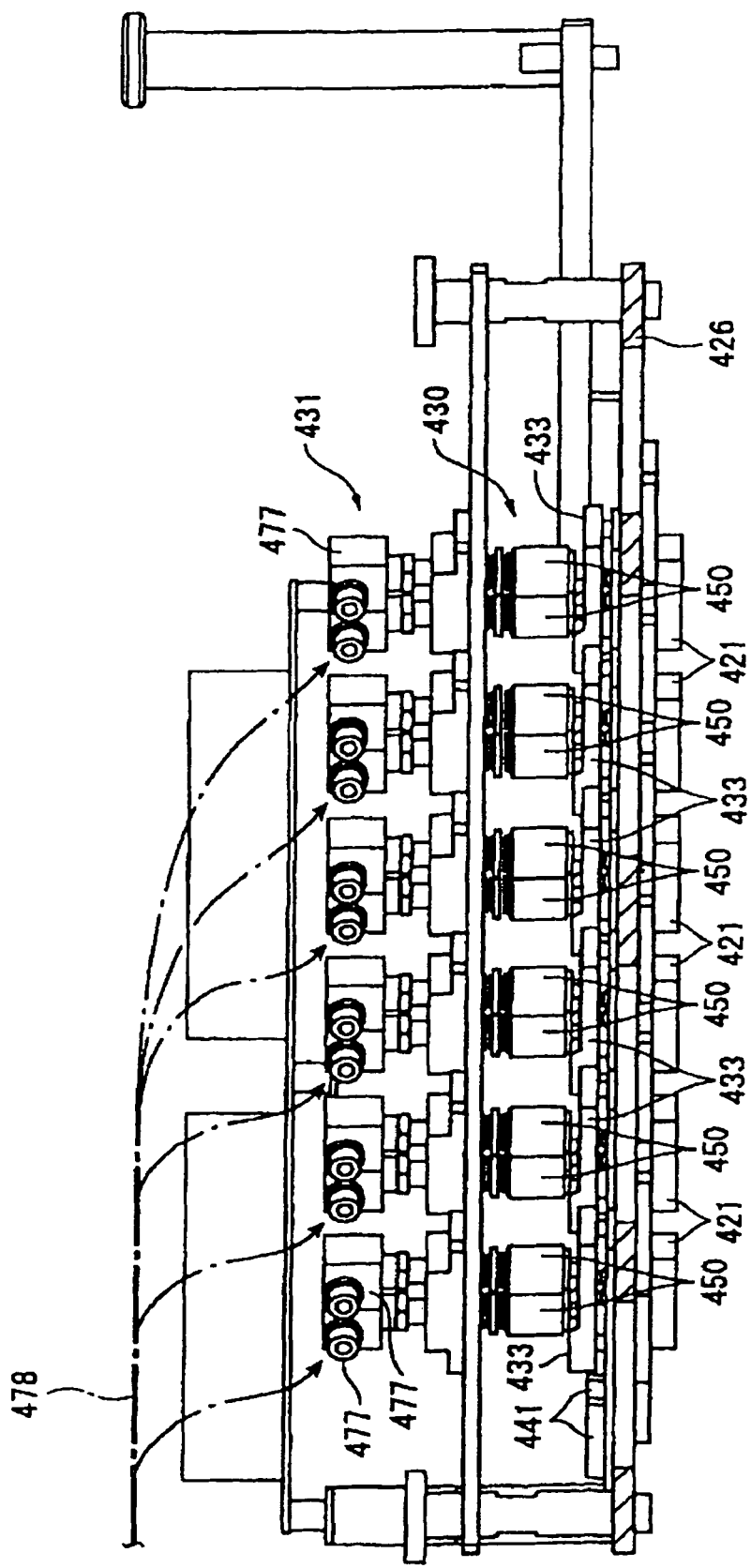
FIG. 26 is a side view illustrating a head unit.
Figure 27:
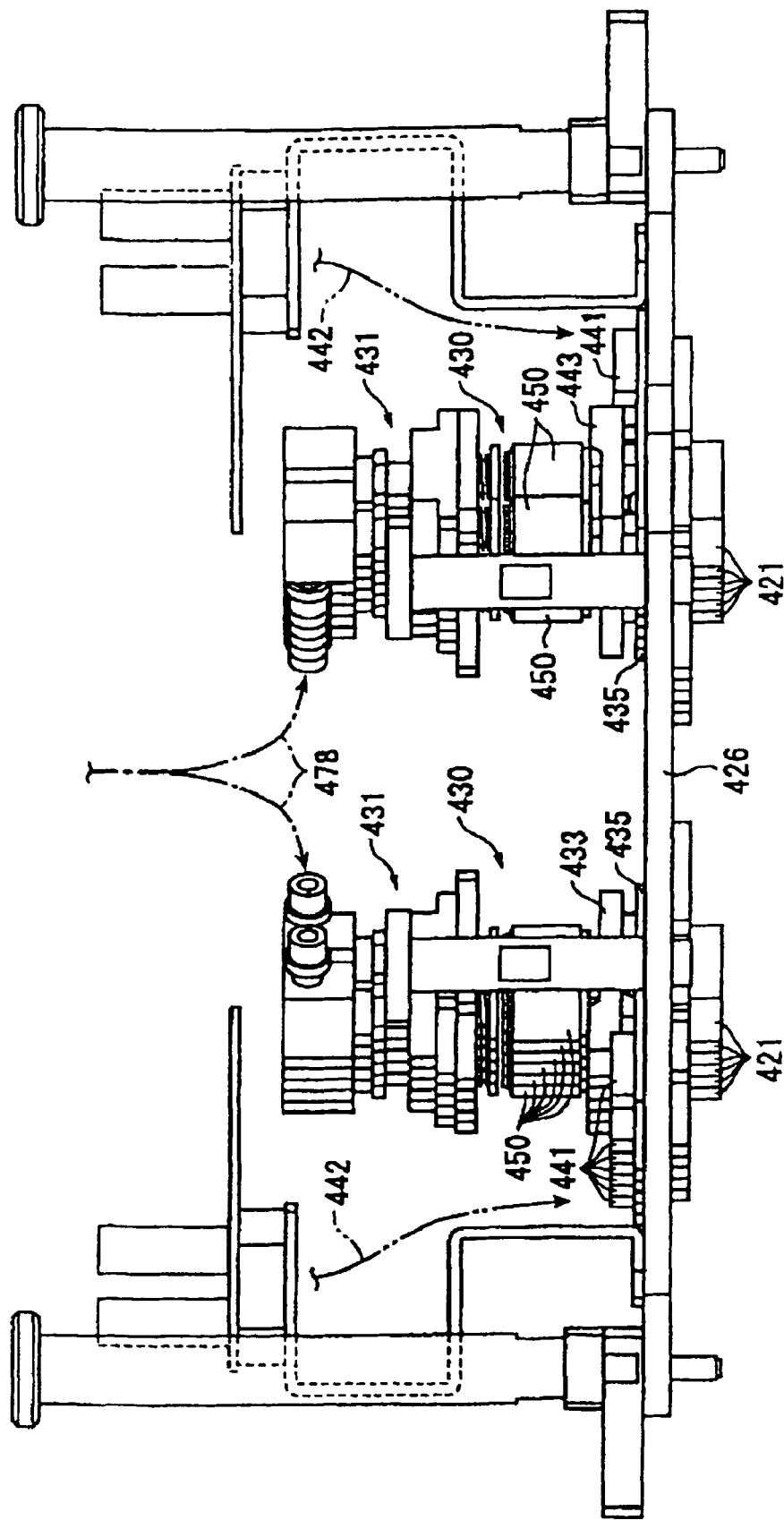
FIG. 27 is a front view illustrating the head unit.
Figure 28:
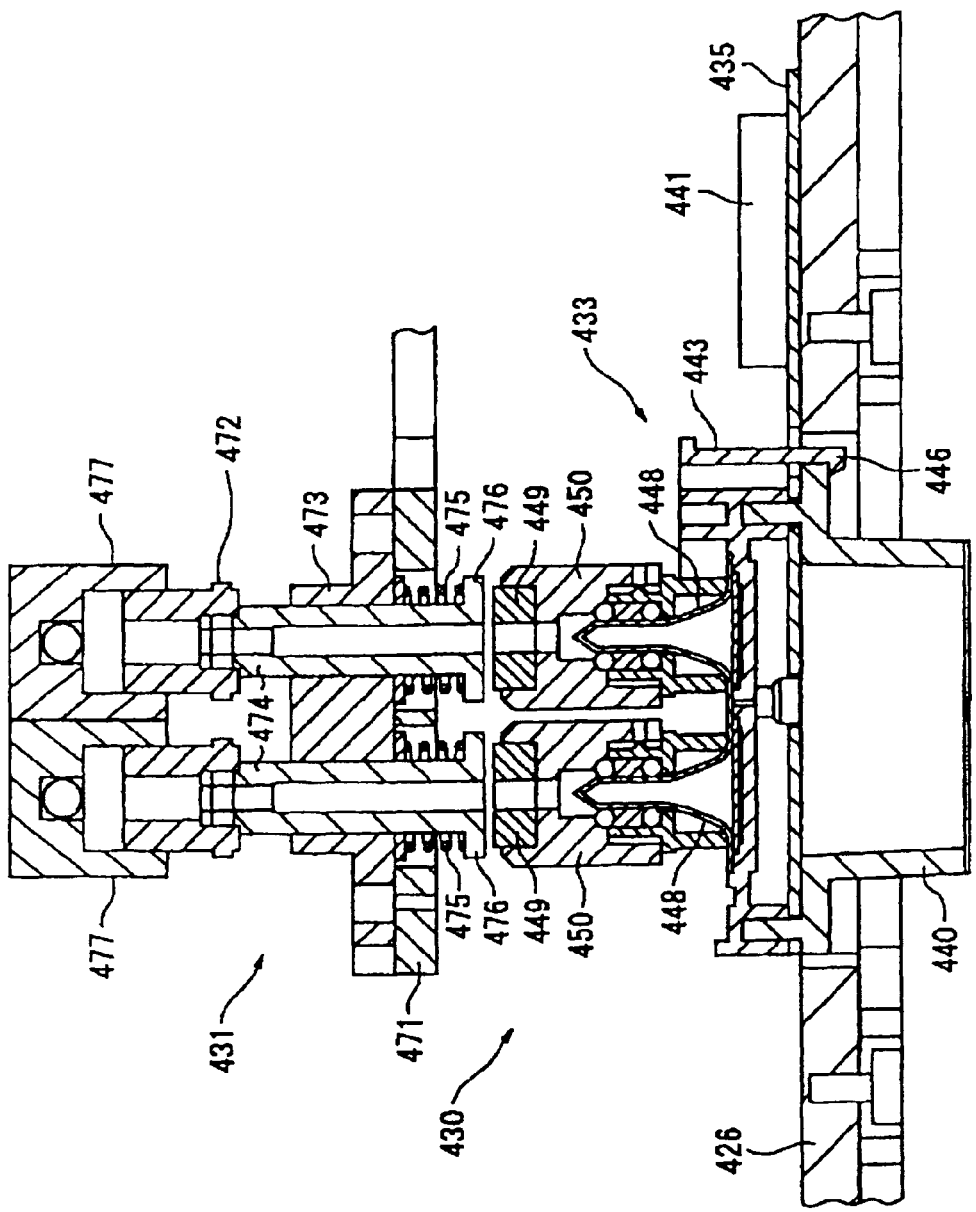
FIG. 28 is a cross-sectional view illustrating the head unit.

The constitution of the head unit 420 is explained below. FIG. 15 is a plan view illustrating a head unit provided in the liquid droplet ejection processing apparatus. FIG. 26 is a side view illustrating the head unit. FIG. 27 is a front view illustrating the head unit. FIG. 28 is a cross-sectional view illustrating the head unit.

The head unit 420 has, as shown in FIG. 15 to FIG. 28, a head main body 430 and an ink supply unit 431. Further, the head main body 430 has a flat plate shaped carriage 426 and a plurality of headers 433 having substantially the same shapes and provided in the carriage 426.
(Constitution of Headers)

Figure 29:
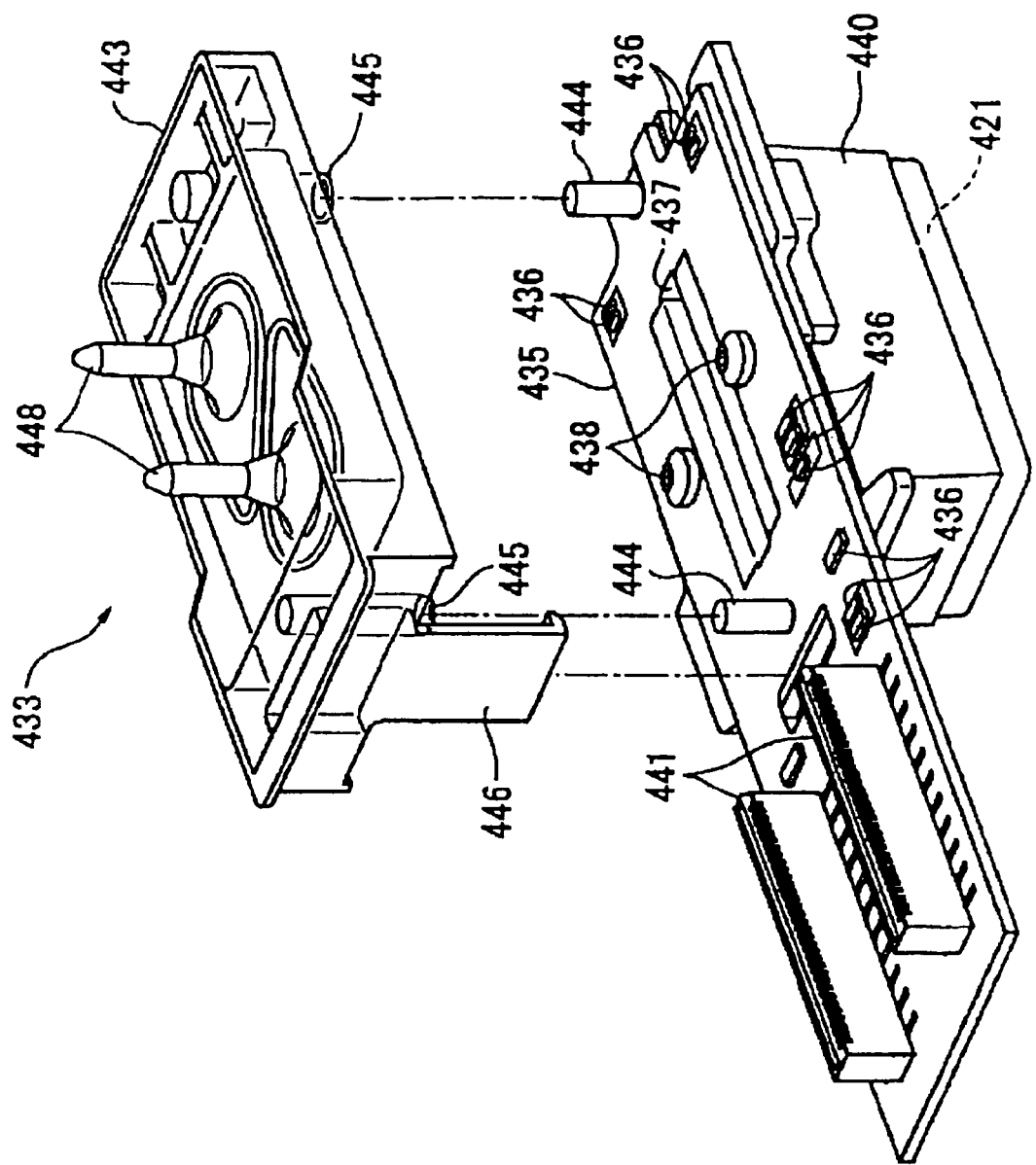
FIG. 29 is a perspective view illustrating the head unit.

FIG. 29 is an exploded perspective view illustrating the headers 433 disposed in the head unit 420.

The headers 433 each have a printed board 435 of a strip shape, as shown in FIG. 29. In this printed board 435, various electrical parts 436 are mounted and electrical wiring lines (not shown) are provided. Further, a window portion 437 is formed to penetrate the printed board 435, at its longitudinal end side (a right side in FIG. 6). Furthermore, in the printed board 435, flow passages 438 through which ink 13 as a filter element material can flow are provided at both sides of the window portion 437.

In addition, an inkjet head 421 is integrally attached to one surface side (lower surface side in FIG. 29) of the printed board 435 by using a attaching member 440, substantially at its longitudinal one end side (right side in FIG. 29). This inkjet head 421 is formed in a longitudinal rectangular shape and attached in a state in which the longitudinal direction thereof is arranged along the longitudinal direction of the printed board 435.

In addition, it is preferable that the respective inkjet heads 421 in the respective headers 433 have substantially the same shape, that is, for example, they may be predetermined standard products of a predetermined quality. Specifically, it is preferable that each inkjet head 421 has the same number of nozzles which will be described later and the nozzle formation positions be equal each other, because it is efficient when assembling the inkjet heads 421 in the carriage 426 and it enhances the assembling accuracy. Further, when using products made through the same manufacturing/assembling processes, it is not necessary to make specific products, so that it is possible to reduce cost.

Furthermore, connectors 441, which is electrically connected to the inkjet head 421 through the electric wiring line 442, is integrally attached to the other surface side (upper surface side in FIG. 29) of the printed board 435, substantially at the other longitudinal end side (left side in FIG. 29). Electrical wiring lines 442 (including power source wiring lines and signal wiring lines) wiring lined to a vice scanning driver 427 are connected to the connectors 441 so as not to affect the movement of the head unit 420. The electrical wiring lines 442 connect a control device (not shown) to the head unit 420. That is, the electrical wiring lines 442 as schematically shown by the arrow of chain double-dashed line in FIG. 15 and FIG. 28 are wired from the vice scanning driver 427 to the peripheral edge of the head unit 420, which is at both sides of the arrangement direction of two rows of the headers 433 in the head unit 420. The electrical wiring lines 442 are then connected to the connector 441, and thus do not cause the electrical noises.

Furthermore, an ink introduction unit 443 is attached to the other surface side (upper surface side in FIG. 29) of the printed board 435 substantially at longitudinal one end side (right side in FIG. 29), corresponding to the inkjet head 421. This ink introduction unit 443 has a positioning tube portion 445 of an approximate cylindrical shape into which a positioning pin 444 provided in the attaching member 440 and penetrating the printed board 435 is inserted, and a fixing claw 446 for fixing the ink introduction unit 443 to the printed board 435.

Furthermore, a pair of connecting portions 448 having substantially a cylindrical shape tapered toward its tip are projected from the ink introduction unit 443. These connecting portions 448 each have an opening (not shown) at the base end portion which would be directed toward the printed board 435, the opening communicating in substantially a liquid-tight manner with the flow passage 438 of the printed board 435, and an opening (not shown) at the front end portion through which the filter element material 13 is capable of flowing.

Furthermore, as shown in FIG. 26 to FIG. 29, seal connecting portions 450 are attached to these connection portions 448, at the pointed end side thereof. The cylindrical inner sides of these seal connecting portions 450 are formed substantially in a cylindrical shape such that the connecting portions 448 are fitted thereinto in a liquid-tight manner, and seal members 449 are formed at the front end portions thereof.

The structure of the main body is explained below.

The mounting support 7 mounts a substrate 101 to which the liquid droplets (liquid) are applied by using the applicator, and includes a mechanism to fix the substrate 101 to a reference position.

An X axial driving motor 2 is connected to the X axial driving shaft 4. The X axial driving motor 2 includes a stepping motor, etc., and if an X axial driving signal is supplied from the control unit 6, the X axial driving motor 2 rotates the X axial driving shaft 4. When the X axial driving shaft 4 is rotated, the inkjet head group 1 moves in the X axial direction.

The Y axial guide shaft 5 is fixed not to move with respect to the base 9. The mounting support 7 includes a Y axial driving motor 3. The Y axial driving motor 3 includes a stepping motor, etc., and if the Y directional driving signals are supplied from the control unit 6, the Y axial driving motor 3 causes the mounting support 7 to move in the Y direction.

The control circuit 6 supplies voltage to control the ejection of liquid droplets, to the respective heads of the inkjet head group 1. In addition, the control unit 6 supplies driving pulse signals for controlling the X axial movement of the inkjet head group 1, to the X axial driving motor 2 and supplies driving pulse signals for controlling the Y axial movement of the mounting support 7, to the Y axial driving motor 3.

The cleaning mechanism 8 includes a mechanism to clean the inkjet head group 1. In the cleaning mechanism 8, a Y axial driving motor (not shown) is provided. By driving this Y axial driving motor, the cleaning mechanism 8 moves along the Y axial guide shaft 5. The movement of the cleaning mechanism 8 is also controlled by the control unit 6.

The heater 15 herein heats the substrate 101 by lamp annealing, and carries out vaporization and drying of liquid applied to the substrate to convert it into a conductive film. The power input/interruption of the heater is also controlled by the control circuit 6. Furthermore, the heat treatment may be carried out by using a hot plate or by using a dry furnace, instead of the heater.

In this inkjet apparatus, pre-ejection and flushing are required for the drawing by the inkjet apparatus.

When forming the external connection terminals as wiring line patterns, the pre-ejection is previously carried out to the outside of the substrate. This prevents blocking of nozzles and ejecting a predetermined quantity of liquid droplets. The quantity of liquid droplets pre-ejected is about 200 to 5000 drops and is ejected from the whole nozzles formed in the inkjet head. Furthermore, the flushing is to eject the liquid droplets from the whole nozzles to ensure the stability of ejection. The quantity of ejection can be set properly, but it is preferable that the same quantity as that in the pre-ejection be ejected.

Figure 16:
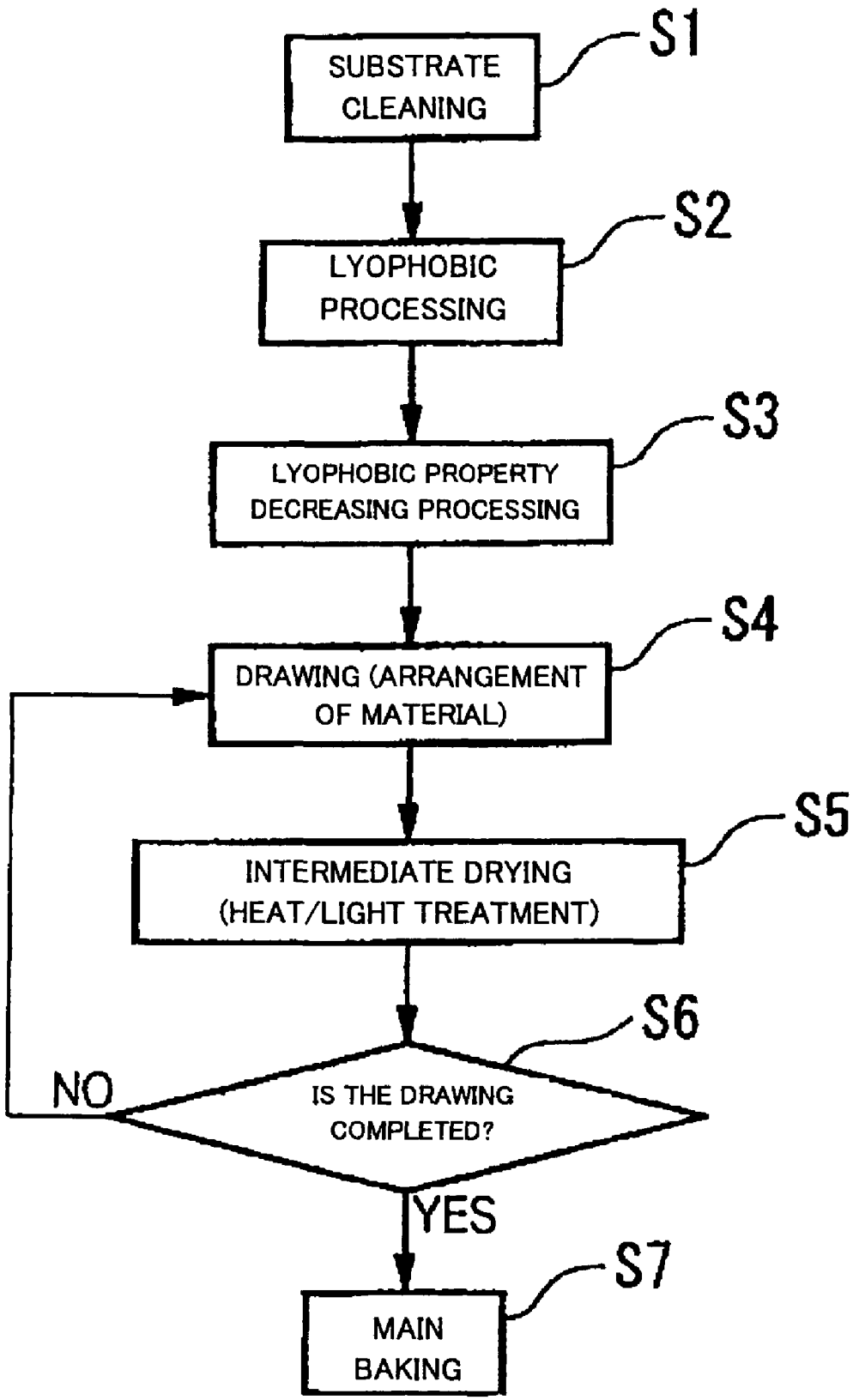
FIG. 16 is a flow chart illustrating an exemplary embodiment of a pattern formation method according to the present invention.
Figure 17:
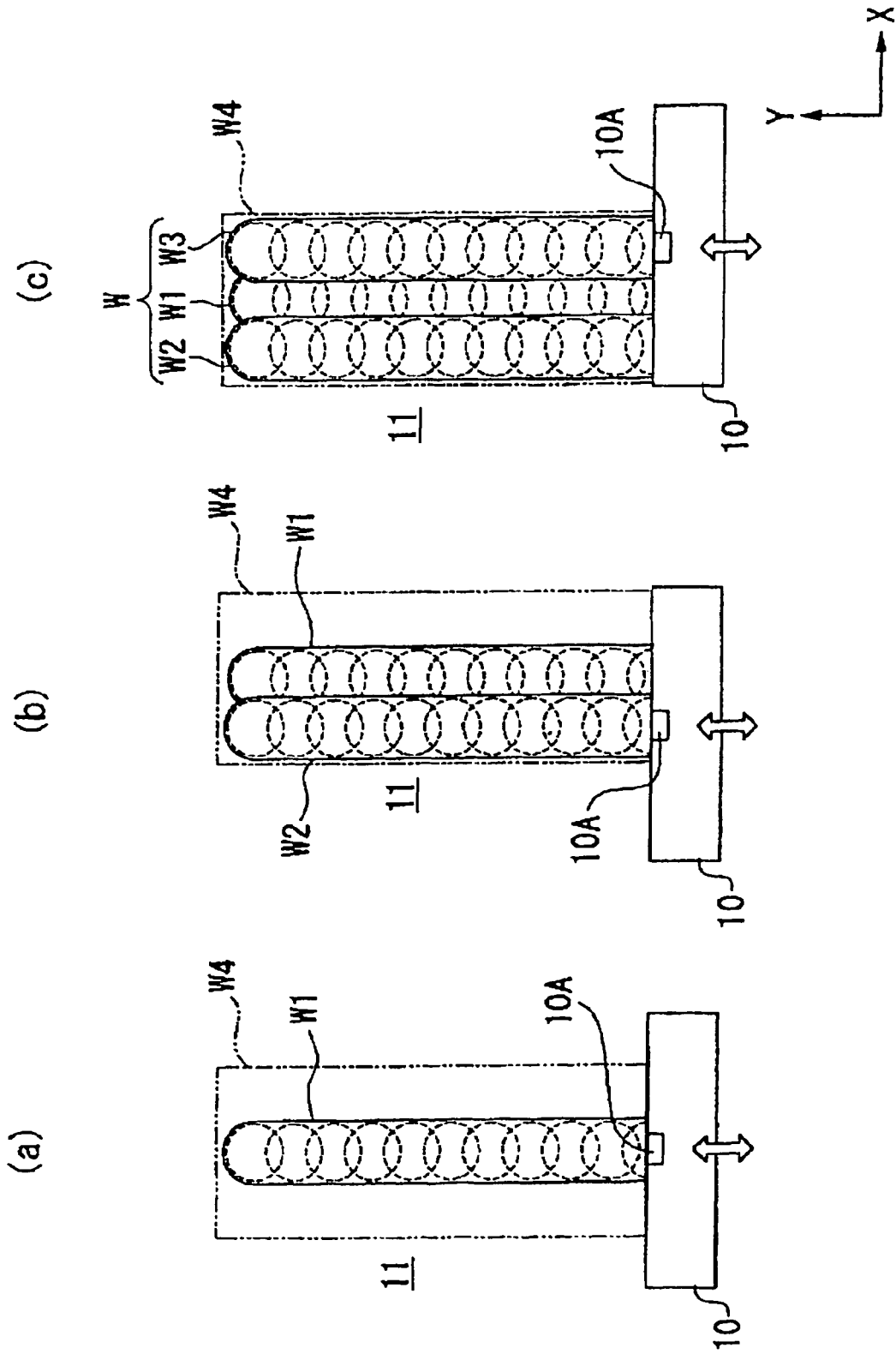
FIGS. 17(a)-17(c) are schematics illustrating an exemplary embodiment of a pattern formation method according to the present invention.

The liquid droplets ejected by the inkjet head are ejected in the order, for example, as shown in FIG. 16 to FIG. 23. The method of forming the external connection terminals according to the present invention is described with reference to the drawings below. FIG. 16 is a flowchart illustrating an exemplary embodiment of the pattern formation method according to the present invention.

In this exemplary embodiment, a case where the conductive film patterns are formed on the substrate will be exemplified.

In FIG. 16, a pattern formation method according to the present embodiment comprises a step (step S1) of cleaning a substrate on which the droplets of liquid material are applied by using a predetermined solvent and the like, a lyophobic processing step (step S2) of constituting a part of surface treatment step on the substrate, a lyophobic-property decreasing step (step S3) of constituting a part of the surface treatment step for adjusting the lyophobic property of the substrate surface on which the lyophobic process is carried out, a material arrangement step (step S4) of arranging on the surface-treated substrate the droplets of the liquid material containing a material for forming conductive film wiring lines by the liquid droplet ejection method to form (draw) a film pattern, an intermediate drying step (step S5) of removing at least a part of the solvent components of the liquid material arranged on the substrate and including heat/light treatment, and a baking step (step S7) of baking the substrate on which a predetermined film pattern is formed. In addition, after the intermediate drying step, it is determined whether a predetermined pattern drawing has been completed or not (step S6). If the pattern formation has been completed, the baking process is carried out. On the other hand, if the pattern drawing has not been completed, the material arrangement step is carried out.

Next, the material arrangement step (step S4) by the liquid droplet ejection method which is a characteristic of the present invention is described with reference to FIG. 17(a) to FIG. 23.

The material arrangement step of the present exemplary embodiment is a process for forming on the substrate the external connection terminals which are the film patterns (the wiring line patterns) W in a line shape, by ejecting the droplets of the liquid material containing the material for forming the conductive wiring lines from the liquid droplet ejecting head onto the substrate. The liquid material is a liquid state substance obtained by dispersing in a dispersion medium conductive particles such as metal which is the material to form the conductive film wiring lines.

In FIG. 16, the material arrangement step (step S4) is for ejecting droplets of the liquid material from the ejecting nozzles 10A of the liquid droplet ejection heads 10 (the aforementioned head group) in the liquid droplet ejection apparatus to arrange the droplets on the substrate 11, and includes a first step (see FIG. 17(a)) of forming widthwise central portion (central pattern) W1 of the film pattern W on the substrate 11, a second step (see FIG. 17(b)) of forming one side portion (a first side pattern) W2 on one side of the central pattern W1 formed on the substrate 11, and a third step (see FIG. 17(c)) of forming the other side portion (a second side pattern) W3 on the other side of the central pattern W1 formed on the substrate 11. By the first, second and third steps, the film pattern W in a line shape are formed as shown in FIG. 17(c).

In the first step, as shown in FIG. 17(a), the liquid droplets of the liquid material are ejected from the liquid droplet ejection head 10 and arranged at a constant space (pitch) on the substrate 11. Further, by repeating the liquid droplet arrangement process, the central pattern W1 in a line shape constituting a part of the film pattern W is formed at the central portion of a formation region W4 of the film pattern W on the substrate 11. Furthermore, since the surface of the substrate 11 is previously processed to have a desired lyophobic property in step S2 and step S3, diffusion of the liquid droplets arranged on the substrate 11 is suppressed. For this reason, it is possible to surely control the pattern shape in a good state and it is easy to obtain a thick film.

Here, after arranging the liquid droplets to form the central pattern W1 on the substrate 11, the intermediate drying step (step S5) is carried out as needed in order to carry out the removal of the dispersion medium. The intermediate drying step may be a light treatment using lamp annealing, in addition to a general heat treatment using a heating apparatus such as a hot plate, an electric furnace or a hot air generator.

Next, in the second step, as shown in FIG. 17(b), the liquid droplets of the liquid material are ejected from the liquid droplet ejection head 10, and as a result, the first side pattern W2 in a line shape adjacent to one side of the central pattern W1 is formed. Here, the liquid droplet ejection head 10 ejects the liquid droplets to superpose the ejected liquid droplets with at least a part of the central pattern W1 formed on the substrate 11 when the first side pattern W2 is formed. In this regard, the liquid droplets constituting the central pattern W1 and the first side pattern W2 are surely connected to each other and discontinuous portions of the material for forming the conductive film wiring line are not generated in the formed film pattern W.

Also, in the second step, the liquid droplets are arranged at a constant pitch on the substrate 11, and by repeating this arrangement process, the first side pattern W2 constituting a part of the film pattern W is formed at one side of the formation region W4 of the film pattern W. Accordingly, the central pattern W1 and the first side pattern W are integrated.

Here, after arranging liquid droplets for forming the first side pattern W2 on the substrate 1, the intermediate drying step (step S5) is carried out as needed in order to carry out the removal of the dispersion medium.

Next, in the third step, as shown in FIG. 17(c), liquid droplets of the liquid material are ejected from the liquid droplet ejection head 10, and as a result, the second side pattern W3 in a line shape adjacent to the other side of the central pattern W1 is formed. Here, the liquid droplet ejection head 10 ejects the liquid droplets to superpose the ejected liquid droplets with at least a part of the central pattern W1 formed on the substrate 11 when the second side pattern W3 is formed. In this regard, the liquid droplets constituting the central pattern W1 and the second side pattern W3 are surely connected to each other, and discontinuous portions of the material to form the conductive film wiring lines are not generated in the formed film pattern W. As a result, the central pattern W1 and the second side pattern W3 are integrated, and thus three patterns W1, W2, W3 in a line shape are integrated, thereby to form the film pattern W with a wide width. In addition, in the third step, the liquid droplets are arranged at a constant pitch, and by repeating this arrangement process, the second side pattern W3 constituting a part of the film pattern W is formed at the other side of the formation region W4 of the film pattern W.

At that time, by adjusting the position (the distance from the central pattern W1) where the liquid droplets are ejected in the second, and the third steps, it is possible to control the final line width of the film pattern W in a line shape. Further, by varying heights (the thicknesses) of the plurality of patterns W1, W2, and W3 formed in each of the first, second and third steps from the surface of the substrate 11, it is possible to control the film thickness of the film pattern W after integrated.

Furthermore, when unevenness is formed in a profile of pattern, it is preferable that fine liquid droplets be applied as needed to fill the unevenness. These fine liquid droplets are smaller in size than those normally applied (indicating the liquid droplets applied into W1, W2, W3), and its quantity of ejection is set to be smaller than that of the normal liquid droplets. Like this, by applying fine liquid droplets, it is possible to form a straight line shaped pattern without unevenness in the profile thereof.

Next, with reference to FIG. 18(a) to FIG. 18(c), the procedure in which the central pattern W1 and the side patterns W2, W3 in a line shape are formed will be described.

First, as shown in FIG. 18(a), the liquid droplets L1 ejected from the liquid droplet ejection head 10 are arranged sequentially with a predetermined pitch on the substrate 11. That is, the liquid droplet ejection head 10 arranges the liquid droplets L1 not to overlap each other on the substrate 11 (first arrangement step). In this example, the arrangement pitch P1 of the liquid droplets L1 is set larger than the diameter of the liquid droplets L1 right after the arrangement on the substrate 11. This allows the liquid droplets L1 right after the arrangement on the substrate 11 not to overlap each other (not to contact each other), and thus integration and diffusion of the liquid droplets L1 on the substrate 11 to be prevented. In addition, the arrangement pitch P1 of the liquid droplets L1 is set to be equal to or smaller than two times of the diameter of the liquid droplets L1 right after the arrangement on the substrate 11.

Here, after arranging the liquid droplets L1 on the substrate 11, the intermediate drying step (step S5) can be carried out as needed in order to carry out the removal of the dispersion medium. The intermediate drying step may be a light treatment using lamp annealing, in addition to a general heat treatment using a heating apparatus such as a hot plate, an electric furnace and a hot air generator, as described above. In this case, the degree of heating or light irradiation may be increased such that the conversion of the dispersion solution into a conductive film occurs as well as the removal of the dispersion medium, but it is sufficient if the dispersion medium is removed to some extent.

Next, as shown in FIG. 18(b), the aforementioned arrangement steps of the liquid droplets are repeated. That is, similarly in FIG. 18(a), the liquid material is ejected as liquid droplets L2 from the liquid droplet ejection head 10 and the liquid droplets L2 are arranged at a constant pitch on the substrate 11.

At that time, the volume (the quantity of liquid material per one liquid droplet) of the liquid droplet L2 and the arrangement pitch P2 are the same as those of the previous liquid droplets L1. In addition, the arrangement positions of the liquid droplets L2 are shifted by ½ pitch from those of the liquid droplets L1, and the liquid droplets L2 in this turn are arranged at the intermediate positions between the liquid droplets L1 previously arranged on the substrate 11 (second arrangement step). As shown in the drawing, by applying the second liquid droplets L2 to complement the spaces between the first liquid droplets L1 which were applied first, it is possible to form wiring line pattern (here, the external connection wiring lines) with excellent planarity.

As described above, the arrangement pitch P1 of the liquid droplets L1 on the substrate 11 is larger than the diameter of the liquid droplets L1 right after the arrangement on the substrate 11 and equal or smaller than two times of the diameter thereof. For this reason, since the liquid droplets L2 are arranged at the intermediate positions between the liquid droplets L1, a part of the liquid droplets L2 overlap the liquid droplets L1 and the spaces between the liquid droplets L1 are filled. At that time, the liquid droplets L2 of this time contact the liquid droplets L1 of the last time, but since the dispersion medium of the liquid droplets L1 of the last time is previously removed completely or to some extent, integration of the both and diffusion on the substrate 11 hardly occur.

Furthermore, in FIG. 18(b), although the position from which the arrangement of the liquid droplets L2 is started is the same side (the left side in FIG. 18(a)) as in the last time, it may be started from the opposite side (the right side). By carrying out the ejection of liquid droplets when moving them in each direction during reciprocation, it is possible to reduce the relative moving distance between the liquid droplet ejection head 10 and the substrate 11.

After arranging the liquid droplets L2 on the substrate 11, the intermediate drying step can be carried out as needed in order to carry out the removal of the dispersion medium, similar to the last time.

By repeating a series of arrangement steps of the liquid droplets a plurality of times, the spaces between the liquid droplets arranged on the substrate 11 are filled, and as shown in FIG. 18(c), the central pattern W1 and the side patterns W2, W3 constituting a continuous pattern in a line shape are formed on the substrate 11. In this case, by increasing repeating times of the liquid droplet arrangement step, the liquid droplets sequentially overlap on the substrate 11. The film thickness of the patterns W1, W2, W3, that is, the height (thickness) from the surface of the substrate 11 increases. The height (thickness) of the line shaped patterns W1, W2, W3 is set in accordance with a desired film thickness required for the final film pattern, and repeating times of the liquid droplet arrangement process are set in accordance with the set film thickness.

Furthermore, the line shaped pattern formation method is not limited to the method shown in FIG. 18(a) to FIG. 18(c). For example, arrangement pitch of the liquid droplets or the quantity of shift in repeating may be set arbitrarily, and arrangement pitch of the liquid droplets on the substrate P when the patterns W1, W2, W3 are formed may be set to values different from each other. For example, when the pitch of the liquid droplets in forming the central pattern W1 is P1, the pitch of the liquid droplets in forming the side patterns W2, W3 may be set wider (for example, P1×2) than P1. Of course, the pitch may be narrower (for example, P1×0.5) than P1. In addition, the volume of the liquid droplet in forming the patterns W1, W2, W3 may be set to have values different from each other. Alternatively, the arrangement atmosphere (temperature, humidity, etc.) of liquid droplets, the atmosphere where the substrate 11 or the liquid droplet ejection head 10 is disposed, that is, the environmental conditions to arrange material, may be set differently in each of the first, second and third steps.

Furthermore, in the present exemplary embodiment, although the plurality of side patterns W2, W3 are formed one by one, two may be formed at the same time. Here, compared the case that the plurality of patterns W2, W3 are formed one by one with the case that two are formed at the same time, since total number of the drying step may be different, it is preferable that the drying condition be set not to damage the lyophobic property of the substrate 11.

Furthermore, in the present exemplary embodiment, although one central pattern W1 is formed in the first step, two or more central patterns W1 may be formed. In addition, by ejecting the liquid droplets to both sides of the plurality of central patterns W1 to make them continuous, it is possible to easily form the film pattern having a wider line width.

Furthermore, although the liquid droplets can be applied using any one of the nozzles, the liquid droplets may be applied using other nozzles in order to reduce or suppress deviation in the quantity of ejection of the liquid droplets between nozzles. For example, it is preferable that a first nozzle be used for the application of the liquid droplets L1 and a second nozzle different from the first nozzle be used for the application of the liquid droplets L2 complementing the spaces between the liquid droplets L1. Furthermore, although the first nozzle and the second nozzle may be provided in the same head, since a plurality of heads are formed as described above, the nozzles may be formed in different heads, respectively. That is, the first nozzle may be formed in a first head, the second nozzle may be formed in a second head. Accordingly, when forming a desired pattern, the application may be carried out using the first nozzle and the second nozzle.

Next, with reference to FIG. 19(a) to FIG. 22(a), an example of the procedure in which the liquid droplets are ejected on the substrate is described below. As shown in these drawings, there is provided on the substrate 11 a lattice-shaped bit map having pixels of a plurality of unit regions on which the liquid droplets of liquid material are arranged. The liquid droplet ejection head 10 ejects liquid droplets toward pixel positions set in the bit map. Here, one pixel is set to a square shape. In addition, it is assumed that the liquid droplet ejection head 10 ejects the liquid droplets from the ejection nozzle 10A while scanning the substrate 11 in the Y axial direction. In the description with reference to FIG. 19 to FIG. 22, "1" is given to the liquid droplets ejected during a first scanning, and "2", "3", . . . and "n" are given to the liquid droplets ejected during a second scanning, a third scanning, and an n-th scanning, respectively. Furthermore, in the following description, the liquid droplets are ejected to each of the regions (pattern formation region) indicated by a gray color in FIG. 19 to form the film pattern W.

As shown in FIG. 19(a), in the first scanning, the liquid droplets are ejected at one pixel interval in the central pattern formation region in order to form the central pattern W1. Here, the liquid droplets ejected to the substrate 11 are landed on the substrate 11 and then are diffused on the substrate 11. That is, as indicated by circles in FIG. 19(a), the liquid droplets landed on the substrate 11 are diffused to each have a diameter c larger than the size of one pixel. Here, since the liquid droplets are ejected at a predetermined interval (one pixel) in the Y axial direction, the liquid droplets arranged on the substrate 11 are set not to overlap each other. In this regard, it is possible to prevent the liquid material from being excessively provided on the substrate 11 in the Y axial direction and it is also possible to reduce or prevent generation of bulge.

Furthermore, in FIG. 19(a), although the liquid droplets when ejected to the substrate 11 are arranged not to overlap each other, the liquid droplets may be arranged to slightly overlap each other. In addition, although the droplets are ejected at one pixel interval, the liquid droplets may be ejected at any number, i.e. two or more, of pixel interval. In this case, it is possible that the space between the liquid droplets on the substrate is complemented by increasing the numbers of the scanning operation and the ejecting operation of the liquid droplet ejection head 10 on the substrate 11.

FIG. 19(b) is a schematic when the liquid droplets are ejected to the substrate 11 from the ejection nozzle 10A of the liquid droplet ejection head 10 in the second scanning. In addition, in FIG. 19(b), "2" is given to the liquid droplets ejected in the second scanning. In the second scanning, the liquid droplets are ejected to complement the spaces between the liquid droplets "1" ejected during the first scanning.

Thus, the central pattern W1 is formed to be continuous between the liquid droplets by the first and second scanning and ejecting operations.

Next, the liquid droplet ejection head 10 and the substrate 11 are relatively shifted in the X axial direction by a size of one pixel. Here, the liquid droplet ejection head 10 is step-shifted in the —X direction with respect to the substrate 11 by the size of one pixel. Then, the liquid droplet ejection head 10 carries out the third scanning. In this regard, as shown in FIG. 20(a), the liquid droplets "3" for forming the first side pattern W2 are arranged on the substrate 11 so as to be adjacent to the —X side of the central pattern W1. Here, the liquid droplets "3" are arranged at one pixel interval in the Y axial direction. Here, the liquid droplets "3" in the first scanning (that is, third scanning in total) after the step-shift of the liquid droplet ejection head 10 in the X axial direction are arranged at positions adjacent to the liquid droplets "1" in the first scanning before the step-shift to the X axis.

FIG. 20(b) is a schematic when the liquid droplets are ejected to the substrate 11 from the liquid droplet ejection head 10 in the fourth scanning. In FIG. 20(b), "4" is given to the liquid droplets ejected in the fourth scanning. In the fourth scanning, the liquid droplets are ejected to complement the spaces between the liquid droplets "3" ejected in the third scanning. Then, the first side pattern W2 is formed to be continuous between the liquid droplets by the third and fourth scanning and ejecting operations. Here, the liquid droplets "4" in the second scanning (that is, the fourth scanning in total) after the step-shift are arranged at positions adjacent to the liquid droplets "2" in the second scanning before the step-shift with respect to the X axis.

Next, the liquid droplet ejection head 10 and the substrate 11 are relatively shifted in the X axial direction by the size of two pixels. Here, the liquid droplet ejection head 10 is step-shifted by the size of two pixels in the +X direction with respect to the substrate. Then, the liquid droplet ejection head 10 carries out the fifth scanning. In this regard, as shown in FIG. 21(a), the liquid droplets "5" for forming the second side pattern W3 are arranged on the substrate to be adjacent to the central pattern W1 on its +X side. Here, the liquid droplets "5" are arranged at one pixel interval in the Y axial direction. Here, the liquid droplets "5" ejected in the fifth scanning, after the step-shift of the liquid droplet ejection head 10 in the X axial direction, are arranged at positions adjacent to the liquid droplets "1" with respect to the X axis.

FIG. 21(b) is a schematic when the liquid droplets are ejected to the substrate 11 from the liquid droplet ejection head 10 in the sixth scanning. In FIG. 21(b), "6" is given to the liquid droplets ejected in the sixth scanning. In the sixth scanning, the liquid droplets are ejected to complement the space between the liquid droplets "5" ejected in the third scanning. Then, the second side pattern W3 is formed to be continuous between the liquid droplets by the fifth and sixth scanning and ejecting operations. Here, the liquid droplets "6" in the sixth scanning are arranged at positions adjacent to the liquid droplets "2" with respect to the X axis.

Like this, although the same nozzle can be used to eject liquid droplets for one pattern, a nozzle different from that may be used as described above. The ejection method using different nozzles to eject liquid droplets is the same as described above. In addition, such utilization of nozzle can be similarly applied to examples which are described below.

FIG. 22(a) is a schematic illustrating an example in which the liquid droplets are ejected and arranged in different procedures. In FIG. 22(a), at positions adjacent to the —X side of the liquid droplets "1" for forming the central pattern W1 with respect to the X axis, the liquid droplets "4" ejected in the second scanning (the fourth scanning in total) after the step shift in the X axial direction of the liquid droplet ejection head 10 are arranged, while at positions adjacent to the —X side of the liquid droplets "2" for forming the central pattern W1 with respect to the X axis, the liquid droplets "3" ejected in the first scanning (the third scanning in total) after the step shift in the X axial direction of the liquid droplet ejection head 10 are arranged. Similarly, at positions adjacent to the +X side of the liquid droplets "1" with respect to the X axis, the liquid droplets "6" ejected in the sixth scanning in total are arranged, while at positions adjacent to the +X side of the liquid droplets "2" for forming the central pattern W1 with respect to the X axis, the liquid droplets "5" ejected in the fifth scanning in total are arranged. Like this, when forming the respective lines W1, W2, W3, the procedure of ejected positions of the liquid droplets may be set to be different for every line.

Furthermore, as in the example shown in FIG. 23, the procedure may be set such that the liquid droplets "1" to form the central pattern W1 are arranged, the liquid droplet ejection head 10 is then step-shifted, the liquid droplets "2" for forming the first side pattern W2 are then arranged, the liquid droplet ejection head 10 is then step-shifted, and then the liquid droplets "3" to form the second side pattern W2 are arranged. In addition, the liquid droplets "4", "5", "6" are sequentially ejected to complement them. Like this, when forming the side patterns W2, W3 after forming the central pattern W1, the formation of the side patterns W2, W3 may start from a state when the formation of the central pattern W1 is not completed, instead after the formation of the central pattern W1 is completed.

FIG. 24(a) and FIG. 24(b) are schematics illustrating an example of the arrangement of liquid droplets for formation of the first and second side patterns W2, W3 on both sides of the central pattern W1 in the second and third steps. In the example of FIG. 24(a), the central pattern W1 is formed under the same conditions as the ejecting conditions (the arranging conditions) described referring to FIG. 18. On the other hand, the ejecting conditions (the arranging conditions) in the second and third steps are different from the ejecting conditions to form the central pattern W1. Specifically, the volume of liquid droplets Ln is set greater than that in the first step. That is, the quantity of liquid material ejected at once is increased. Incidentally, in this example, the arrangement pitch of the liquid droplets Ln is the same as in the first step. By increasing the volume of the liquid droplets Ln, it is possible to shorten the total time to form the film pattern W and thus to accomplish an enhancement in throughput. Furthermore, since the increased volume of the liquid droplets is apt to cause the bulge, the volume condition of liquid droplets under which the bulge is not rendered is previously obtained in accordance with the material characteristics of the liquid material, and then the maximum possible volume of liquid droplets to be ejected may be set based on the obtained condition.

In the example of FIG. 24(b), in the ejecting conditions of the second and third steps, the arrangement pitch of the liquid droplets Ln is narrower than that of the first step. In addition, the volume of the liquid droplets Ln may be the same or larger than that in the first step, as shown in FIG. 24(a). By narrowing the arrangement pitch of liquid droplets, the quantity of liquid droplets to be arranged per unit area increases, so that the pattern can be formed in a shorter time.

Like above, various ejection methods are described, but a method of ejecting liquid droplets by using different nozzles is further described below.

When forming one pattern (here, one line), it can be formed by using a plurality of nozzles. For example, it is possible that the liquid droplets of the first time are applied by using a first nozzle and the liquid droplets of the second time are applied by using a second nozzle different from the first nozzle. In addition, the liquid droplets of the third time may be applied by using a third nozzle and the liquid droplets of the fourth time by using a fourth nozzle. By using such an application method, when there is non-uniformity in quantity of ejection due to the nozzles, the non-uniformity thereof can be reduced or suppressed to the minimum. That is, when the application is executed by using the same nozzle, the total quantity of ejection of the liquid droplets varies. As a result, the difference in film thickness and the difference in resistance value in the electrodes are influenced. Therefore, in order to address or solve such problems, by applying liquid droplets by using different nozzles for one electrode (or one pattern), it is possible to suppress the difference in film thickness to the minimum, and it is also possible to make the resistance of electrode substantially uniform.

<Surface Treatment Step>

Next, the surface treatment steps S2, S3 shown in FIG. 16 is described below. In the surface treatment step, the surface of a substrate on which a conductive film wiring line (external connection terminals) is formed is processed to be lyophobic to a liquid material (step S2).

Specifically, the surface treatment is carried out on the substrate such that a predetermined contact angle with respect to liquid material containing conductive particles is 60° or more, and preferably 90° or more and 110° or less. The method of controlling lyophobic property (wettability) can include, for example, a method of forming self-organization film, a plasma treatment method, a UV irradiation method, etc.

In the self-organization-film formation method, a self-organization film made of an organic molecular film, etc. is formed on a surface of the substrate on which a conductive film wiring line is formed. The organic molecular film to treat the substrate surface comprises a functional group capable of binding to the substrate, a functional group, such as the lyophilic radical or the lyophobic radical on an opposite side thereof for reforming the surface property (controlling the surface energy) of the substrate, and straight chain of carbons or partially branched chain of carbons for connecting the functional groups to each other. Therefore, the organic molecular film is coupled to the substrate and self-organized to form a molecular film, for example, a monomolecular film.

Here, the self-organization film includes a coupling functional group capable of reacting with the constituent atoms of the underlying layer, etc. of the base layer of the substrate and other straight chain molecules. The self-organization film is a film formed by orienting compounds having very high orientation property due to the interaction between the straight molecules. Since the self-organization film is formed by orienting mono-molecules, the film thickness can be very thin and a uniform film at a molecule level is obtained. That is, since the same molecules are positioned on the surface of the film, it is possible to give a uniform and excellent lyophobic property or lyophilic property to the surface of film.

By using, for example, fluoroalkylsilane as a compound having a high orientation property, the respective compounds are oriented such that the fluoroalkyl radical is positioned on the film surface to form a self-organization film and a uniform lyophobic property is given to the film surface.

Examples of the compound of forming the self-organization film include fluoroalkylsilane (hereinafter, referred to as "FAS") such as heptadecafluoro-1,1,2,2tetrahydrodesiltriethoxysilane, heptadecafluoro-1,1,2,2tetrahydrodesiltrimethoxysilane, heptadecafluoro-1,1,2,2tetrahydrodesiltrichlorosilane, tridecafluoro-1,1,2,2tetrahydrooctyltriethoxysilane, tridecafluoro-1,1,2,2tetrahydrooctyltrimethoxysilane, tridecafluoro-1,1,2,2tetrahydrooctyltrichlorosilane, trifluoropropyltrimethoxysilane, etc. These compounds may be used separately or in combination of two or more thereof.

Furthermore, by using FAS, the close adherence to the substrate and the excellent lyophobic property can be obtained.

FAS is generally expressed in a structural formula RnSiX (4-n). Here, n indicates an integer of 1 or more and 3 or less, and X indicates a hydrolytic radical, such as a methoxy radical, ethoxy radical, halogen atom, etc. In addition, R is a fluoroalkyl radical and has a structure (CF3)(CF2)x(CH2)y (here, x is an integer of 0 or more and 10 or less, and y is an integer of 0 or more and 4 or less), and when a plurality of R or X are coupled to Si, all the R or X may be the same or different from each other, respectively. The hydrolytic radical indicated by X forms silanol through the hydrolysis and reacts with hydroxyl radical of a base of the substrate (glass, silicon) to be coupled to the substrate with a siloxane bond. On the other hand, since R has fluoro radical, such as (CF3) at the surface thereof, it reforms the base surface of the substrate into a non-wettable surface having a low surface energy.

The self-organization film including the organic molecular film, etc. is formed on the substrate by putting the aforementioned raw material compounds and the substrate in the same sealed vessel and leaving them alone at a room temperature for two or three days. In addition, by maintaining the whole sealed vessel at 100° C., the self-organization film is formed on the surface within about three hours. Although these are the methods to form the self-organization film in a vapor phase, the self-organization film may be formed in a liquid phase. For example, by immersing the substrate in a solution containing raw material compounds, and then cleaning and drying the substrate, a self-organization film is formed on the substrate. Furthermore, before the formation of the self-organization film, by irradiating to the surface of the substrate with UV light or by cleaning the substrate with a solvent, it is preferable that the pre-treatment be carried out on the substrate surface.

After carrying out the FAS treatment, the lyophobic-property decreasing step of providing the substrate with a desired lyophobic property is carried out as needed (step S3). That is, when the FAS treatment is carried out as the lyophobic process, the film pattern W formed on the substrate may be easily peeled off from the substrate due to excessively intensive lyophobic property. Therefore, the step of decreasing (adjusting) the lyophobic property is carried out. The step of decreasing the lyophobic property can includes the UV ray irradiation processing with a wavelength of about 170 to 400 nm. By irradiating the substrate with UV ray of a predetermined power for a predetermined time, the lyophobic property of the substrate, on which the FAS treatment is carried out, decreases, and as a result, the substrate has a desired lyophobic property. Otherwise, by exposing the substrate to the ozone atmosphere, the lyophobic property of the substrate can be controlled.

On the other hand, in the plasma treatment method, the plasma irradiation is carried out on the substrate at a normal pressure or under vacuum. The kind of gas to be used for the plasma treatment can be selected variously in consideration of the surface material of the substrate on which a conductive film wiring line is formed. The process gas can include, for example, 4fluoromethane, perfluorohexane, perfluorodecane, etc.

A treatment of processing the substrate surface so as to be lyophobic may be carried out by adhering a film having a desired lyophobic property, for example, a polyimide film processed with 4fluoroethylene, to the substrate surface. Alternatively, the polyimide film having a high lyophobic property may be used as a substrate as it is.

By carrying out such surface treatment on the surface on which the external connection terminals are formed, when liquid droplets are ejected and applied thereto, it is possible to form a wiring pattern having a good planarity and a small unevenness in a profile. Furthermore, when the electrodes 73, 74, 75 are formed, the aforementioned surface treatment is carried out on the interlayer insulating layer 283. Alternatively, when electrodes are formed at positions corresponding to the transparent electrode 77 by the inkjet method, by carrying out the surface treatment on the electrodes 73, 74, 75 corresponding to the lower layer, electrodes (external connection terminals) can be formed on the uppermost thereof by the inkjet method.

<Intermediate Drying Step>

Next, the intermediate drying step S5 shown in FIG. 16 is described in detail below. In the intermediate drying step (heat/light treatment step), a dispersion medium or a coating material contained in the liquid droplets ejected on the substrate is removed. That is, from the liquid material for the conductive film formation disposed on the substrate, it is necessary to remove the dispersion medium in order to facilitate electrical contact between particles. In addition, when any coating material such as an organic material and the like is coated on the surface of the conductive fine particles in order to enhance the dispersibility, it is also necessary to remove the coating material.

Although the heat/light treatment is typically carried out in the atmosphere, it may be carried out in the atmosphere of inert gas, such as nitrogen, argon, or helium, if necessary. The temperature of the heat/light treatment is appropriately determined in consideration of the boiling point (vapor pressure) of the dispersion medium, the types or pressure of the atmosphere gas, thermal behaviours of the particles such as dispersibility or oxidizability, presence/absence or quantity of the coating material, and heat resistant temperature of the base material. For example, in order to remove the coating material made of an organic material, it is necessary to carry out baking at about 300° C. In addition, when a substrate made of plastic and the like is used, it is preferable that the sintering be carried out at the room temperature or more and 100° C. or less.

In the heat treatment, for example, a heating apparatus such as a hot plate or an electric furnace, may be used. In the light treatment, lamp annealing may be used. An infrared lamp, a xenon lamp, a YAG laser, an argon laser, a carbonic acid gas laser, an excimer laser using XeF, XeCl, XeBr, KrF, KrCl, ArF, ArCl, etc., may be used as a light source of light used in the lamp annealing although it is not specifically limited to them. Light sources having power output range between 10 W and 5000 W are generally used, but in the present exemplary embodiment, light sources have power output range between 100 W and 1000 W are sufficient. When the electrical contact between fine particles is surely established by the aforementioned heat/light treatment, the dispersion solution is converted into a conductive film.

Furthermore, at that time, it is allowable to raise the degree of the heating or the light irradiation until the dispersion solution is converted into a conductive film as well as the removal of the dispersion medium. However, since the conversion into the conductive film may be carried out in the heat treatment/light treatment step in a bundle after the completion of the arrangement of all the liquid materials, it is sufficient to remove some portion of the dispersion medium in this step. For example, in the heat treatment, it is allowable to carry out the heating at typically about 100° C. for several minutes. In addition, the dry treatment may proceed at the same time in combination with the ejection of liquid droplets. For example, the substrate is previously heated, or a dispersion medium having low boiling point is used in combination with the cooling of the liquid droplet ejection head, so that the drying of liquid droplets can be proceeded just after the arrangement of liquid droplets on the substrate.

As described above, there may be a case that the overheating treatment is carried out after the application. That is, the substrate 101 on which the fine particle dispersion solution 21 is applied in a predetermined pattern is subjected to the heat treatment to remove a solvent and facilitate the electrical contact between the fine particles. Although the heat treatment is typically carried out in the atmosphere, it may be carried out in the ambient of inert gas such as nitrogen, argon, helium, etc., if necessary. The temperature of the aforementioned heat treatment may be properly determined according to the boiling point (vapor pressure) of the solvent, pressure, thermal behaviours of the fine particles, and it is not specifically limited, however, it is preferably performed at the room temperature or more and 300° C. or less. When a substrate made of plastic and the like is used, it is preferable that the treatment is carried out at the room temperature or more and 100° C. or less.

The heat treatment may be carried out with lamp annealing other than using a hot plate, an electric furnace, and the like. An infrared lamp, a xenon lamp, a YAG laser, an argon laser, a carbonic acid gas laser, an excimer laser using XeF, XeCl, XeBr, KrF, KrCl, ArF, ArCl, etc., and the like may be used as a light source of light used in the lamp annealing, although it is not specifically limited to them. Light sources having output power range between 10 W and 5000 W are generally used, but in the present exemplary embodiment, it is sufficient for the light sources to have output power range between 100 W and 1000 W.

As shown in FIG. 7 and FIG. 8, a plurality of concave portions B are formed on the surfaces of the second external connection terminals 66c, 70, 70 provided in the electro-optical device according to the present embodiment, and the second external connection terminals 66c, 70, 70 are divided into a plurality of electrodes by the concave portions. As shown in FIG. 6, although the uniformity of the fixing condition at the fixing portions 65 is promoted by changing the number of the external connection terminals in accordance with the line widths of the light-emitting power source wiring lines 23R and the signal lines 22, since the plurality of concave portions B are formed on the surfaces of the second external connection terminals 66c, 70, 70, the second external connection terminals 66c, 70, 70 are also divided into a plurality of electrodes. It is very appropriate to accomplish the uniformity of the fixing condition.

In addition, the first interlayer insulating layers 284 are formed at the ends of the electrodes 73, 74, 75, so that the convex portions 79 are formed at the ends of the second external connection terminals 66c, 70, 70. The convex portions 79 have a function of preventing the conductive particles 41b contained in the anisotropic conductive film 40 from protruding toward the side portion of the second external connection terminals 66c, 70, 70 when the display substrate 10 and the relay substrate 20 are fixed using the isotropic conductive film 40. As a result, since more conductive particles 41b are disposed on the second external connection terminals 66c, 70, 70, it is possible to obtain an appropriate structure in which the electric resistance at the fixing portion 65 is greatly reduced.

Since the display substrate 20 of the present exemplary embodiment described above is provided with a constitution for making the pressing condition at the fixing portion 65 uniform, the external connection terminal 34 formed on the relay substrate 30 which is fixed on the fixing portion 65 may be formed in the same line width as that of the light-emitting power source wiring lines 23R, the control signal wiring lines for the scanning line driving circuit 24a and the like as shown in FIG. 6. However, in order to fix the relay substrate 30 and the display substrate 20 under more uniform pressing condition, it is preferable that the external connection terminals 34 have the same pattern as the second external connection terminals 66c, 70, 70, and the like formed on the fixing portion 65.

On the other hand, there is a tendency to make the first interlayer insulating layer 284 thick in order to reduce the problems in display such as non-uniformity of display and deterioration of contrast by reducing parasitic capacitance between the various wiring lines formed on the second interlayer insulating layer 283 and cathodes 26 formed to cover the upper side (the side opposite to the substrate 60) of the substantial display region 62 and dummy region 63 as shown in FIG. 5.

FIG. 9 is an enlarged view of the second external connection terminals 70, 70 in which first interlayer insulating layers 284 are formed to be thick. As shown in FIG. 9, if the first interlayer insulating layers 284 between the electrodes 74, 75 become thicker, the height of the convex portions 79 formed at the ends of the first interlayer insulating terminals 70, 70 becomes higher than that of the convex portions 79 as shown in FIG. 8. Incidentally, the first interlayer insulating layers 284 are made of SiN in FIGS. 7 and 8, but the first interlayer insulating layers 284 are made of $SiO_2$ in FIG. 9.

As shown in FIG. 9, since the thickness of the first interlayer insulating layers 284 increases, the height of the convex portion 79 formed at the ends of the electrodes 74, 75 become higher, and thus the thickness between the electrodes 74, 75 and the transparent electrode 77 becomes thinner. In addition, when the first interlayer insulating layers 284 are directly formed on the second interlayer insulating layers 283 and the electrodes 74, 75, the convex portions 79 formed at ends of the electrodes 74, 75 have protruding shapes toward the surfaces of the first interlayer insulating layer 284 between the first external connection terminals 70, 70 as well as toward the electrodes 74, 75. Accordingly, the planarity is deteriorated, and problems may occur when the relay substrate 30 is fixed by using the isotropic conductive film 40.

Figure 10:
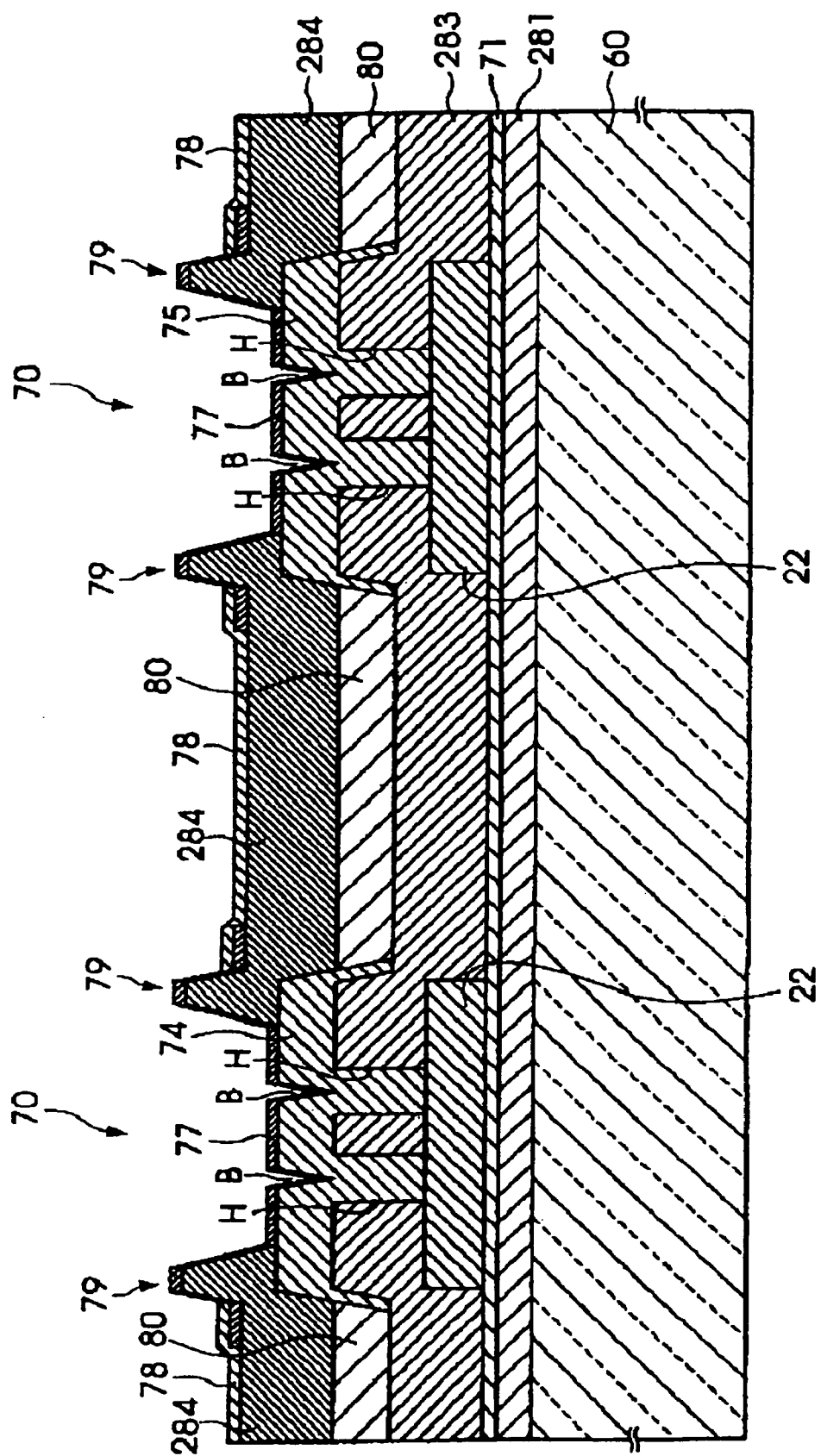
FIG. 10 is an enlarged schematic of the first external connection terminals 70, 70 in which the first interlayer insulating layer 284 is formed thick and a planarization film is formed between electrodes 74, 75.
Figure 13:
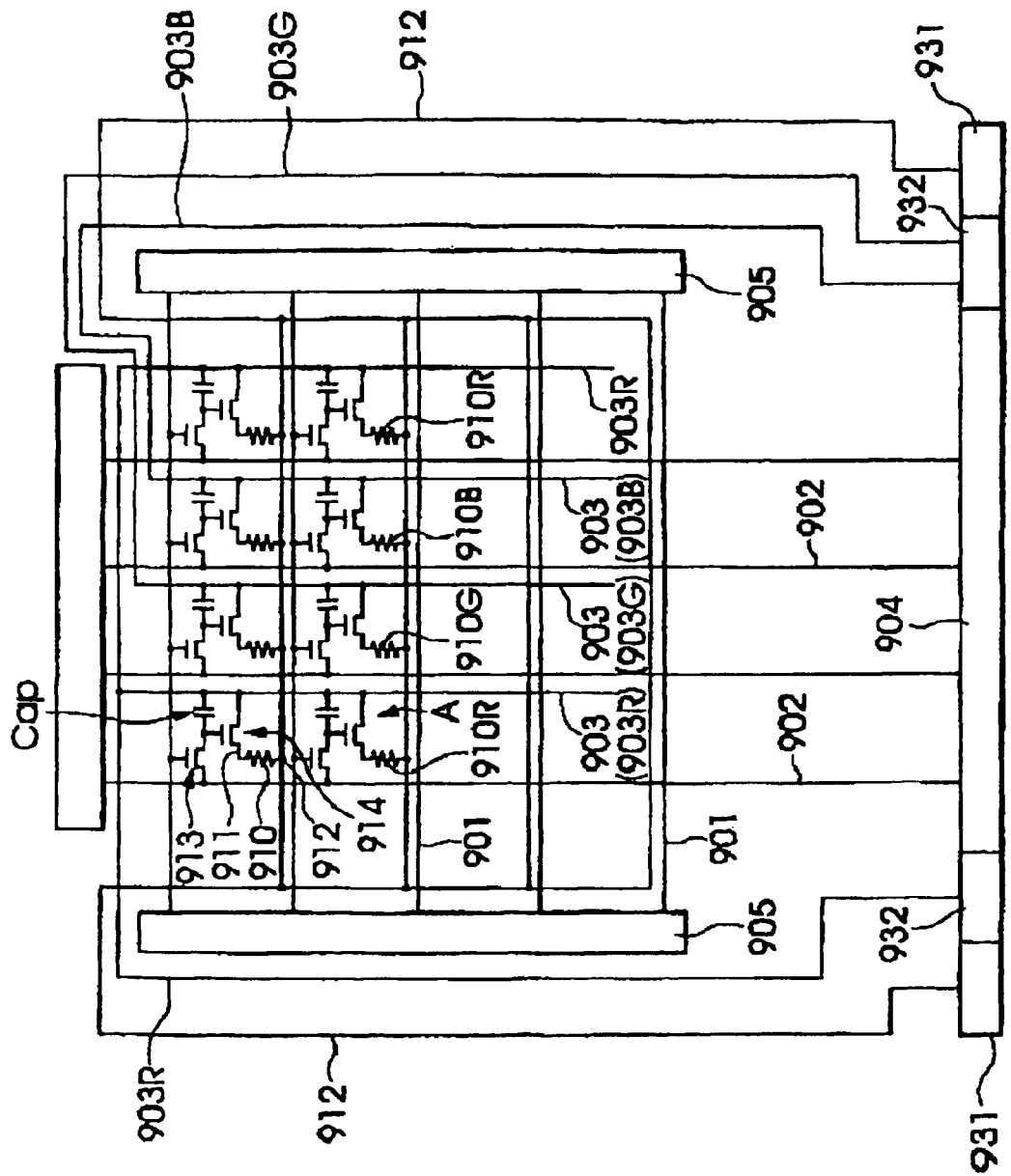
FIG. 13 is a schematic illustrating a wiring structure of a related art electro-optical device.

In order to address or avoid such problems, in the present exemplary embodiment, a planarization film to planarize the unevenness formed by the electrodes 74, 75 is provided. FIG. 10 is an enlarged view of the first external connection terminals 70, 70 in which first interlayer insulating layers 284 are formed thickly and which are provided with a planarization film between the electrodes 74, 75. The planarization film 80 is formed at parts other than the parts in which the electrodes 74 and the electrodes 75, etc., are formed before the first interlayer insulating layers 284 are formed.

Referring to FIG. 10, it can be noted that the first interlayer insulating layers 284 are formed after the planarization film 80 is formed, so that the difference of altitude (step) between the surfaces of the first interlayer insulating layers 284 between the first external connection terminals 70, 70 and the convex portions 79 become small. Therefore, such problem can not occur when the relay substrate 30 is fixed by using the isotropic conductive film 40.

Figure 25:
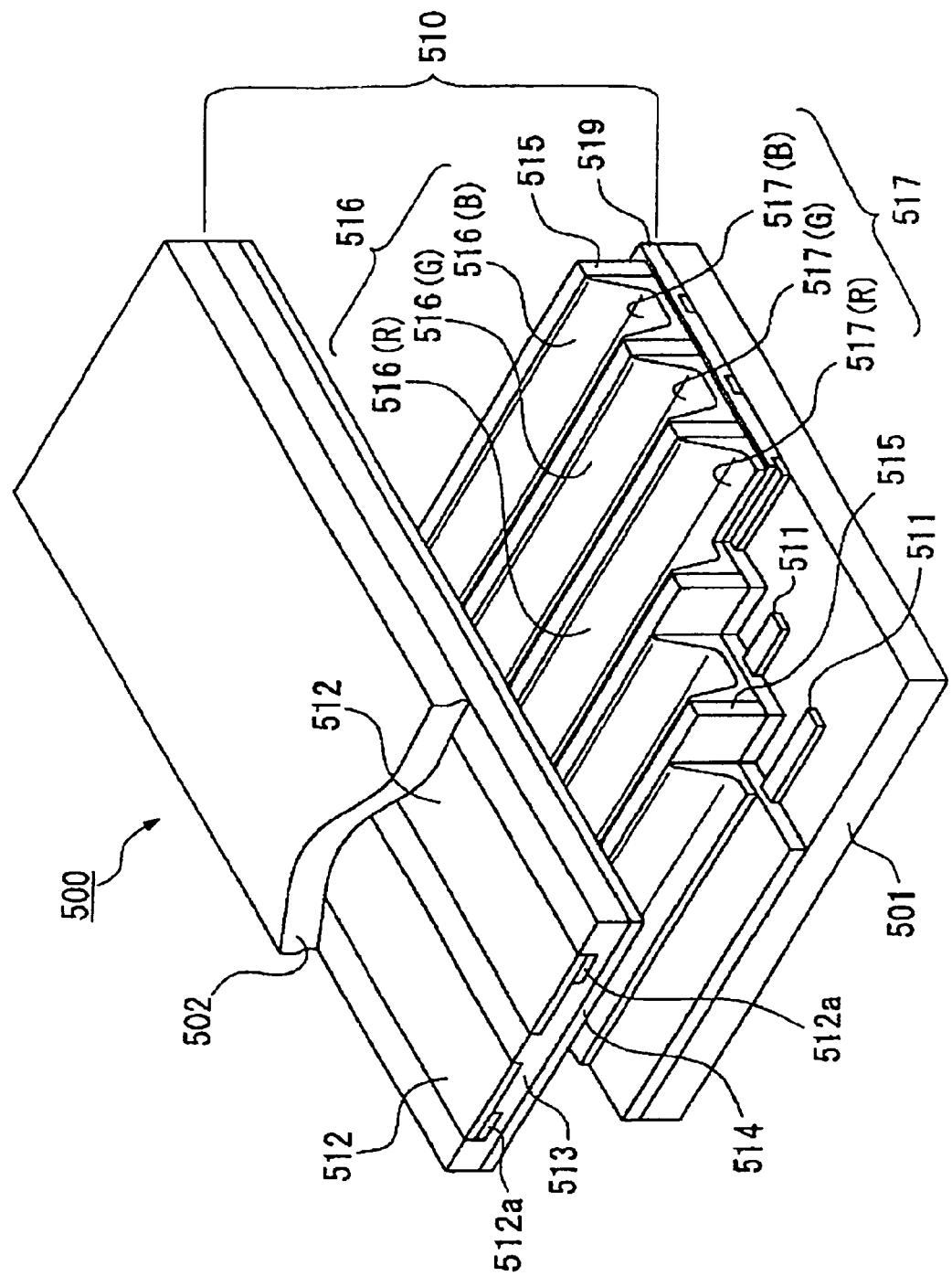
FIG. 25 is an exploded perspective view illustrating an example where an electro-optical device according to an exemplary embodiment of the present invention, is the electro-optical device being applied to a plasma type display device.

Although the electro-optical device according to an exemplary embodiment of the present invention is described above, the terminal structure can be applied to a display, such as a liquid crystal display device, a plasma display device shown in FIG. 25, an inorganic EL device, an electrophoresis device, other than the organic EL (electroluminescence) device, as mentioned above.

Furthermore, although the mounting terminals formed in the display is exemplified, the tape sides mounted on the mounting terminals may be formed by the same process as the present invention. That is, the external connection terminals of the display may have the same structure as the related art one and the tape (the relay substrate in the specification) may be formed by the process described above.

Furthermore, if the electro-optical device described above, the electronic parts such as a motherboard comprising CPU (central processing unit), a keyboard, hard disc are assembled into a housing, the notebook type of personal computer 600 (an electronic apparatus) shown in FIG. 11 is manufactured. FIG. 11 is a schematic illustrating an example of an electronic apparatus including the electro-optical device according to an embodiment of the present invention. In FIG. 9, reference numerals 601, 602, and 603 indicate a housing, a liquid crystal display device, and a keyboard, respectively. FIG. 12 is a perspective view illustrating a mobile phone as another example of electronic apparatus. The mobile phone 700 shown in FIG. 12 includes an antenna 701, a receiver 702, a transmitter 703, a liquid crystal display device 704, and a manipulation button portion 705, etc.

Furthermore, although the aforementioned exemplary embodiment is described by illustrating a notebook computer and a mobile phone as an electronic apparatus, the present invention is not limited to them, but can be applied to electronic apparatuses such as a liquid crystal projector, multimedia adaptive personal computer (PC) and engineering workstation (EWS), a pager, a word processor, a television, a view finder type or monitor direct view type of videotape recorder, an electronic notebook, an electronic desk calculator, a car navigation device, a POS terminal, and a device provided with a touch panel, for example.

ADVANTAGES

As described above, according to the present invention, since the planarization film is formed between the first terminals, between the second terminals and between the first terminals and the second terminals, and the insulating film is formed on the planarization film at the ends of the first terminals and at the ends of the second terminals, the level of the insulating layer formed at the ends of the first terminals and at the ends of the second terminals is not much higher than that of the surface of the insulating layer formed on the planarization film, and thus it is possible to ensure the planarity, even when the insulating film is formed to be thick. As a result, an advantage is provided that a connection failure is not generated in the wiring lines connected to the first terminals and the second terminals.

The invention claimed is:

1. An electro-optical device comprising:
an effective display region including a pixel, the pixel including a first electrode, a second electrode, and a light-emitting layer between the first electrode and the second electrode, the effective display region having a first edge extending in a first direction and a second edge extending in a second direction that intersects the first direction; and
a wiring line connected to the second electrode at a position to the periphery of the effective display region, the wiring line including a first wiring layer and a second wiring layer that are electrically connected to each other and that overlap each other, the first wiring layer and the second wiring layer both extending along the first edge and the second edge of the effective display region.

2. The electro-optical device according to claim 1, the effective display region having a third edge extending in the first direction, the first wiring layer and the second wiring layer both following the first, second and third edges of the effective display region.

3. The electro-optical device according to claim 1, further comprising a power source wiring connected to the first electrode at a position between the effective display region and the wiring line, the power source wiring including the first wiring layer and the second wiring layer.

4. The electro-optical device according to claim 1, further comprising a transistor connected to the first electrode, the transistor including a gate electrode connected to the first wiring layer, the transistor including a source electrode and a drain electrode, one of the source electrode and the drain electrode being provided in the second wiring layer.

5. The electro-optical device according to claim 1, the light-emitting layer including an organic electroluminescent material.

6. The electro-optical device according to claim 1, further comprising an insulation layer between the first wiring layer and the second wiring layer, the first wiring layer and the second wiring layer being electrically connected to each other through a contact hole.

7. An electro-optical device comprising:
a substrate having a first edge and a second edge that intersects the first edge;
a first electrode disposed above the substrate;
a second electrode;
a light-emitting layer that is disposed between the first electrode and the second electrode; and
a first wiring line electrically connected to the second electrode and disposed in a first layer; and
a second wiring line electrically connected to the first wiring line, the second wiring line being disposed in a second layer,
each of the first wiring line and second wiring line being disposed in a first area positioned between the first edge and the first electrode,
each of the first wiring line and second wiring line being disposed in a second area positioned between the second edge and the first electrode,
the first wiring line overlapping at least a part of the second wiring line, and
the first wiring line having a first portion that extends along the first edge and a second portion that extends along the second edge, and the second wiring line having a third portion that extends along the first edge and a fourth portion that extends along the second edge.

8. An electro-optical device comprising:
a substrate having a first edge and a second edge that intersects the first edge;
a first electrode disposed above the substrate;
a second electrode;
a light-emitting layer that is disposed between the first electrode and the second electrode; and
a first wiring line electrically connected to the second electrode, the first wiring being disposed in a first layer; and
a second wiring line electrically connected to the first wiring line, the second wiring line being disposed in a second layer,
the first wiring line overlapping at least a part of the second wiring line,
the first wiring line having a first portion that extends along a first direction intersecting the second edge and that is disposed between the first electrode and the first edge, and
the first wiring line having a second portion that extends along a second direction intersecting the first edge and that is disposed between the second edge and the first electrode,
the second wiring line having a third portion that extends along the first direction and that is disposed between the first edge and the first electrode, and
the second wiring line having a fourth portion that extends along the second direction and that is disposed between the first edge and the first electrode.

9. An electro-optical device comprising:
a substrate having a first edge and a second edge that intersects the first edge;
a first electrode disposed above the substrate;
a second electrode;
a light-emitting layer that is disposed between the first electrode and the second electrode;
a first wiring line electrically connected to the second electrode, and the first wiring line being disposed in a first layer; and
a second wiring line electrically connected to the second electrode, the second wiring line being disposed in a second layer,
the first wiring line having a first portion that extends along and the second wiring line being disposed in a first area positioned between the first edge and the first electrode,
each of the first wiring line and the second wiring line being disposed in a second area positioned between the second edge and the first electrode;
the first wiring line ovelapping at least a part of the second wiring line,
the first wiring line having a first portion that extends along the first edge and a second portion that extends along the second edge, and
the second wiring line having a third portion that extends along the first edge and a fourth portion that extends along the second edge.

10. An electro-optical device comprising:
a substrate having a first edge and a second edge that intersects the first edge;
a first electrode disposed above the substrate;
a second electrode;
a light-emitting layer that is disposed between the first electrode and the second electrode;
a first wiring line electrically connected to the second electrode, the first wiring line being disposed in a first layer,
a second wiring line electrically connected to the second electrode, the second wiring being disposed in a second layer,
each of the first wiring line and the second wiring line being disposed in a first area positioned between the first edge and the first electrode,
each of the first wiring line and the second wiring line being disposed in a second area positioned between the second edge and the first electrode;
the first wiring line overlapping at least a part of the second wiring line,
the first wiring line having a first portion that extends along a first direction intersecting the first edge and a second portion that extends along a second direction intersecting the second edge, and
the second wiring line having a third portion that extends along the first direction and a fourth portion that extends along the second direction.

11. The electro-optical device according to claim 8,
the substrate having a third edge that intersects the first edge and that is positioned opposite to the second edge with regard to the first electrode, and
the first wiring line having a fifth portion that extends along the second direction and that is disposed between the third edge and the first electrode.

12. The electro-optical device according to claim 8, further comprising a power source line electrically connected to the first electrode at a position between the first electrode and one of the first wiring line and second wiring line.

13. The electro-optical device according to claim 8, further comprising a transistor electrically connected to the first electrode, the transistor that includes a gate electrode, a source electrode and a drain electrode, the transistor being electrically connected to the power source line,
one of the source electrode and the drain electrode being disposed in the first layer.

14. The electro-optical device according to claim 8,
wherein the light-emitting layer includes an organic electroluminescent material.

15. The electro-optical device according to claim 8, further comprising an insulation layer disposed between the first layer and the second layer,
wherein the first wiring line is electrically connected to the second wiring line through a contact hole disposed in the insulation layer.

16. The electro-optical device according to claim 8,
wherein:
the second layer is disposed above the substrate;
the first layer is disposed above the second layer;
the first electrode is disposed above the first layer; and
the second electrode is disposed above the first electrode.

17. The electro-optical device according to claim 8, further comprising an external connection terminal electrically connected to the second wiring line,
the external connection terminal being disposed between the first electrode and a forth edge of the substrate that is positioned opposite to the first edge with regard to the first electrode.

18. The electro-optical device according to claim 10,
the second wiring line having a sixth portion that extends along the second direction and that is disposed between the third edge and the first electrode.

19. The electro-optical device according to claim 8, further comprising a power source line for supplying the light-emitting layer through the first electrode,
- the substrate having a third edge that intersects the first edge and that is positioned opposite to the second edge with regard to the first electrode, and
- the power source line being disposed between the first portion and the third edge.

20. The electro-optical device according to claim 8,
- at least one contact hole through which the first portion is electrically connected to the third portion being formed between the first portion and the second portion.

21. The electro-optical device according to claim 8,
- at least one contact hole through which the second portion is electrically connected to the fourth portion being formed between the second portion and the fourth portion.

22. The electro-optical device according to claim 8,
- the first portion being electrically connected to the second portion, and
- the third portion being electrically connected to the fourth portion.

* * * * *